United States Patent
Lee

(10) Patent No.: US 10,930,713 B2
(45) Date of Patent: Feb. 23, 2021

(54) DISPLAY PANEL AND DISPLAY APPARATUS HAVING THE SAME

(71) Applicant: SAMSUNG ELECTRONICS CO., LTD., Suwon-si (KR)

(72) Inventor: Kye Hoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/599,436

(22) Filed: Oct. 11, 2019

(65) Prior Publication Data
US 2020/0119101 A1 Apr. 16, 2020

(30) Foreign Application Priority Data
Oct. 11, 2018 (KR) .................. 10-2018-0120979

(51) Int. Cl.
*H01L 27/32* (2006.01)
*H01L 51/52* (2006.01)

(52) U.S. Cl.
CPC ........ *H01L 27/322* (2013.01); *H01L 51/5281* (2013.01); *H01L 27/3244* (2013.01)

(58) Field of Classification Search
CPC ............. H01L 27/322; H01L 51/5281; H01L 27/3244; H01L 27/3213; H01L 2251/5369; G02F 1/133514
See application file for complete search history.

(56) References Cited

U.S. PATENT DOCUMENTS

| | | | |
|---|---|---|---|
| 6,038,006 A | | 3/2000 | Sasaki et al. |
| 2006/0232202 A1* | | 10/2006 | Matsuda ............ H01L 51/5265 |
| | | | 313/506 |
| 2010/0231485 A1 | | 9/2010 | Cok et al. |
| 2017/0153366 A1 | | 6/2017 | Park et al. |
| 2017/0186819 A1 | | 6/2017 | Yun et al. |

FOREIGN PATENT DOCUMENTS

| | | |
|---|---|---|
| EP | 0 249 991 A2 | 12/1987 |
| EP | 0 249 991 A3 | 12/1987 |
| EP | 3 444 846 A1 | 2/2019 |

(Continued)

OTHER PUBLICATIONS

Communication dated Feb. 11, 2020 issued by the European Intellectual Property Office in counterpart European Application No. 19196799.1.

(Continued)

*Primary Examiner* — David Vu
(74) *Attorney, Agent, or Firm* — Sughrue Mion, PLLC

(57) ABSTRACT

A display panel, including a light source configured to emit blue light; and a quantum dot color filter layer including: a red light converter including a red quantum dot particle configured to convert the blue light into red light, a green light converter including a green quantum dot particle configured to convert the blue light into green light, a light transmitting portion configured to transmit the blue light, and a white light generator including a first region and a second region, wherein the first region comprises a plurality of yellow quantum dot particles configured to convert the blue light into yellow light, wherein the second region transmits the blue light.

21 Claims, 27 Drawing Sheets

(56) References Cited

FOREIGN PATENT DOCUMENTS

| KR | 10-2015-0125207 A | 11/2015 |
| KR | 10-2016-0000811 A | 1/2016 |
| KR | 10-2017-0051839 A | 5/2017 |
| WO | 2011/030882 A1 | 3/2011 |

OTHER PUBLICATIONS

International Search Report dated Feb. 10, 2020 issued by the International Searching Authority in counterpart International Application No. PCT/KR2019/013170 (PCT/ISA/210).
"Color vision", Wikipedia, May 18, 2011, 16 pages total, XP055662139 https://en.wikipedia.org/wiki/Color_vision.

* cited by examiner

FIG. 26

|  | Case #1 (R,G,B Pixel) | Case #2 (White Pixel) |
|---|---|---|
| PIXEL QD CONVERSION EFFICIENCY | ~81.25% | ~100% |
| COLOR FILTER PHOTON EFFICIENCY | ~70% | 100% |
| VISIBILITY (RELATIVE) | ~75% | 100% |

DISPLAY PANEL AND DISPLAY APPARATUS HAVING THE SAME

CROSS-REFERENCE TO RELATED APPLICATION(S)

This application is based on and claims priority under 35 U.S.C. § 119 to Korean Patent Application No. 10-2018-0120979, filed on Oct. 11, 2018, in the Korean Intellectual Property Office, the disclosure of which is incorporated by reference herein in its entirety

BACKGROUND

1. Field

The disclosure relates to a display panel using a quantum dot as a color filter and a display apparatus including the same

2. Description of Related Art

A display apparatus may be an apparatus that displays image data in various formats such as a broadcast signal by having a display panel for displaying an image.

In general, a display panel may be a self-emissive display panel that emits light by itself, or a non-self-emissive display panel that requires a separate light source. The self-emissive display panel may include a cathode ray tube (CRT) panel, an electro luminescence (EL) panel, an organic light emitting diode (OLED) panel, a vacuum fluorescence display (VFD) panel, a field emission display (FED) panel, and a plasma display panel (PDP). The non-self-emissive display panel may include a liquid crystal display (LCD) panel.

In the case of the self-emissive display panel such as an OLED panel, because light can be controlled for each pixel, a separate backlight unit is not required, and it is possible to implement a thin display apparatus. In addition, a self-emissive display panel can exhibit superior performance in comparison with LCD in terms of viewing angle and contrast.

SUMMARY

It is an aspect of the present disclosure to provide a display panel capable of obtaining improved brightness by implementing a white color by providing a separate white sub-pixel used to implement a white color and by turning on the white sub-pixel, and a display apparatus having the same.

It is another aspect of the present disclosure to provide a display panel capable of reducing the loss, which is caused by quantum dot color conversion, by using a mixed color of blue and yellow upon implementing a white sub-pixel, and a display apparatus having the same.

Additional aspects of the present disclosure will be set forth in part in the description which follows and, in part, will be obvious from the description, or may be learned by practice of the present disclosure.

In accordance with an aspect of the disclosure, a display panel includes a light source configured to emit blue light; and a quantum dot color filter layer including: a red light converter including a red quantum dot particle configured to convert the blue light into red light, a green light converter including a green quantum dot particle configured to convert the blue light into green light, a light transmitting portion configured to transmit the blue light, and a white light generator including a yellow quantum dot particle configured to convert a first portion of the blue light into yellow light, wherein the white light generator may be configured to transmit a second portion of the blue light.

The yellow light may have an emission peak wavelength in a range of 540 nm to 580 nm.

The display panel may further include a blue light blocking filter arranged at a front of the red light converter and a front of the green light converter, and configured to block blue light.

The display panel may further include a blue light transmission filter arranged at a front of the light transmitting portion and configured to transmit the blue light and to block all light other than the blue light.

The light source may further include a red sub-pixel region configured to emit the blue light toward the red light converter; a green sub-pixel region configured to emit the blue light toward the green light converter; a blue sub-pixel region configured to emit the blue light toward the light transmitting portion; and a white sub-pixel region configured to emit the blue light toward the white light generator.

The display panel may further include an anode including: a red pixel electrode configured to supply a first current to the red sub-pixel region; a green pixel electrode configured to supply a second current to the green sub-pixel region; a blue pixel electrode configured to supply a third current to the blue sub-pixel region; and a white pixel electrode configured to supply a fourth current to the white sub-pixel region.

A size of the red pixel electrode may be smaller than a size of the red light converter, a size of the green pixel electrode may be smaller than a size of the green light converter, a size of the blue pixel electrode may be smaller than a size of the light transmitting portion, and a size of the white pixel electrode may be smaller than a size of the white light generator.

The display panel may further include a plurality of partitions, wherein a first partition of the plurality of partitions is arranged between the red light converter and the green light converter, a second partition of the plurality of partitions is arranged between the green light converter and the light transmitting portion, and a third partition of the plurality of partitions is arranged between the light transmitting portion and the white light generator, and wherein the plurality of partitions is formed of a black material absorbing light.

The display panel may further include a reflective layer formed on a front surface of the plurality of partitions and configured to reflect incident light.

The display panel may further include an anti-reflection layer arranged at a front of the quantum dot color filter layer, and configured to prevent reflection of external light.

The light transmitting portion may include a scattering particle configured to scatter incident light.

The light transmitting portion may include a blue dye configured to transmit the blue light among incident light and absorb all light other than the blue light.

In accordance with an aspect of the disclosure, a display panel includes a light source configured to emit blue light; and a quantum dot color filter layer including: a red light converter including a red quantum dot particle configured to convert the blue light into red light, a green light converter including a green quantum dot particle configured to convert the blue light into green light, a light transmitting portion configured to transmit the blue light, and a white light generator including a red quantum dot particle configured to convert a first portion of the blue light into red light, a green quantum dot particle configured to convert a second portion of the blue light into green light, wherein the white light generator may be configured to transmit a third portion of the blue light.

In accordance with an aspect of the disclosure, a display apparatus includes a light source configured to emit blue light; a quantum dot color filter layer including: a red light converter including a red quantum dot particle configured to convert the blue light into red light, a green light converter including a green quantum dot particle configured to convert the blue light into green light, a light transmitting portion configured to transmit the blue light, and a white light generator including a yellow quantum dot particle configured to convert a first portion of the blue light into yellow light, wherein the white light generator may be further configured to transmit a second portion of the blue light; an anode including: a red pixel electrode corresponding to the red light converter, a green pixel electrode corresponding to the green light converter, a blue pixel electrode corresponding to the light transmitting portion, and a white pixel electrode corresponding to the white light generator; and a controller configured to control the white pixel electrode to supply a current to the light source to output white light.

The display apparatus may further include: a thin film transistor (TFT) array including: a red pixel TFT connected to the red pixel electrode, a green pixel TFT connected to the green pixel electrode, a blue pixel TFT connected to the blue pixel electrode, and a white pixel TFT connected to the white pixel electrode, wherein the controller may be further configured to activate the white pixel TFT to output the white light.

The yellow light may have an emission peak wavelength in a range of 540 nm to 580 nm.

The display apparatus may further include a blue light blocking filter arranged at a front of the red light converter and a front of the green light converter and configured to block blue light.

The display apparatus may further include a blue light transmission filter arranged at a front of the light transmitting portion and configured to transmit blue light and to block all light other than the blue light.

The display apparatus may further include an anti-reflection layer arranged at a front of the quantum dot color filter layer and configured to prevent reflection of external light.

The light transmitting portion may include a scattering particle configured to scatter incident light.

In accordance with an aspect of the disclosure, a display panel includes a light source configured to emit blue light; and a quantum dot color filter layer including: a red light converter including a plurality of red quantum dot particles configured to convert the blue light into red light, a green light converter including a plurality of green quantum dot particles configured to convert the blue light into green light, a first light transmitting portion configured to transmit the blue light, and a white light generator including first region and a second region, wherein the first region includes a plurality of yellow quantum dot particles configured to convert the blue light into yellow light, and wherein the second region includes a second light transmitting portion configured to transmit the blue light.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 26 is a table comparing relative efficiency of a red sub-pixel, a green sub-pixel and a blue sub-pixel with relative efficiency of a white sub-pixel in the display panel according to an embodiment.

DETAILED DESCRIPTION

Figure 1:
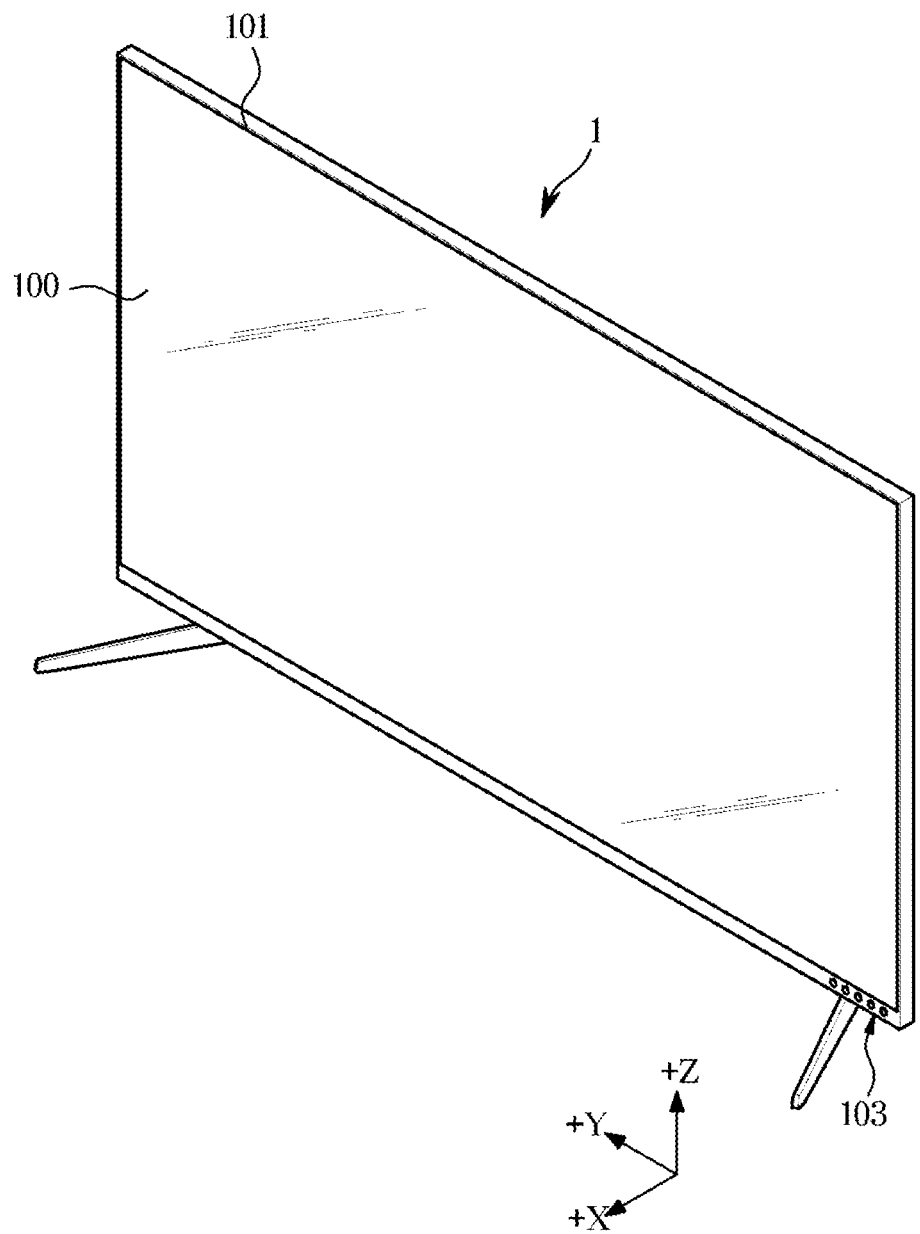
FIG. 1 is a view illustrating an exterior of a display apparatus according to an embodiment.

In the following description, like reference numerals refer to like elements throughout the specification. Well-known functions or constructions are not described in detail since they would obscure the one or more exemplar embodiments with unnecessary detail. Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

As used herein, the singular forms "a," "an" and "the" are intended to include the plural forms as well, unless the context clearly indicates otherwise.

Reference will now be made in detail to embodiments of a display panel and a display apparatus including the same, examples of which are illustrated in the accompanying drawings.

FIG. 1 is a view illustrating an exterior of a display apparatus according to an embodiment.

According to an embodiment, a display apparatus 1 is a device configured to process image signals received from the outside and visually display an image corresponding to the processed image signals. As illustrated in FIG. 1, the display apparatus 1 may be implemented as a TV, but the embodiment of the display apparatus 1 is not limited thereto. For example, the display apparatus 1 may be implemented as a monitor of a computer, or a display of a navigation terminal device or various portable terminal devices. The portable terminal device may be a notebook computer, a smart phone, a tablet PC, or a personal digital assistance (PDA).

According to an embodiment, display apparatus 1 includes a body 101 configured to form an appearance and configured to accommodate or support various components included in the display apparatus 1, and a display panel 100 configured to display an image.

The body 101 may be provided with an input interface 103 configured to receive a command from a user, and the command is related to power on/off, channel conversion, mode setting, volume control, and brightness control of a screen of the display apparatus 1. Further, other than the input interface 103 provided in the body 101, a remote controller may be provided to remotely receive a command from a user which may be related to the control of the display apparatus 1.

The display panel 100 may be a self-emissive display panel in which a plurality of pixels included in the display panel 100 emits light from the plurality of pixels themselves to generate an image. The light source used for the plurality of pixels included in the display panel 100 may generate light by electro luminescence. For example, the light source may include an electroluminescent diode such as an organic light emitting diode (OLED) or a light emitting diode (LED). In the embodiment to be described later, a case, in which an OLED is used as a light source, will be described as an example for a more detailed description.

In the following embodiment, for convenience of description, a direction in which an image is output to a viewer, for example a direction illustrated in FIG. 1 as a +x direction, is referred to as a front side, a −x direction opposite thereto is referred to as a rear side, and the rear side is referred to as being behind the front side.

Figure 2:
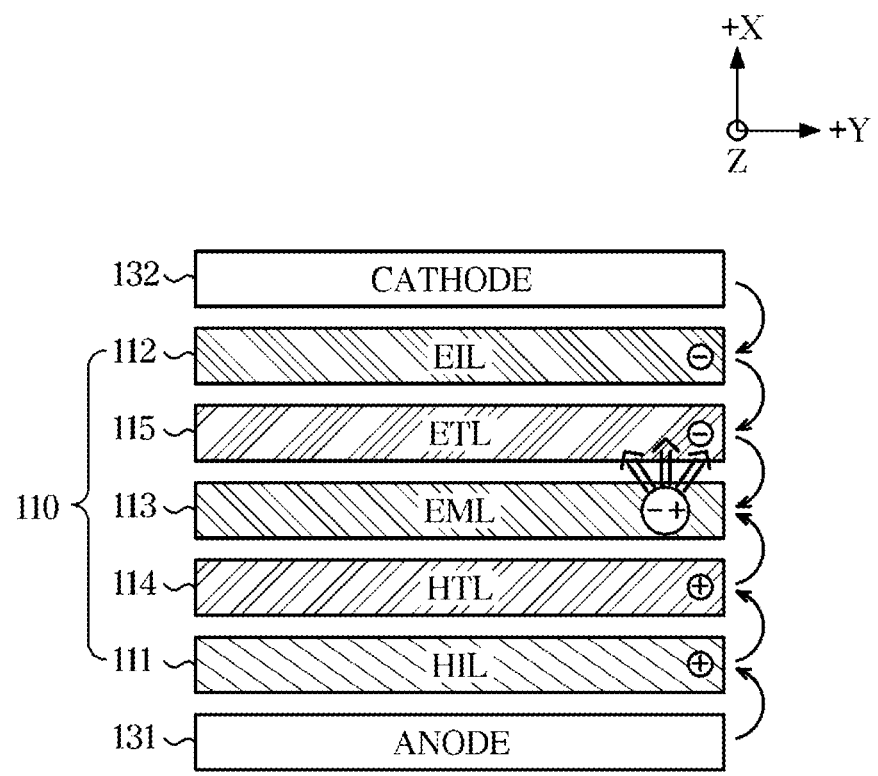
FIG. 2 is a view illustrating a structure of an organic light emitting diode (OLED) used as a light source of a display panel according to an embodiment.

FIG. 2 is a view illustrating a structure of an organic light emitting diode (OLED) used as a light source of a display panel according to an embodiment.

A light source 110 used in the display panel 100 according to an embodiment may include an emitting layer (EML) 113, a hole transporting layer (HTL) 114 located behind the EML 113, an electron transporting layer (ETL) 115 located in front of the EML 113, a hole injection layer (HIL) 111 located at the rear of the HTL 114, and an electron injection layer (EIL) 112 located in front of the ETL 115.

A hole may be injected from an anode 131 to the HTL 114 through the HIL 111, and an electron may be injected from a cathode 132 to the ETL 115 through the EIL 112.

The hole passing through the HTL 114 and the electron passing through the ETL 115 move to the EML 113 and then the hole and the electron are recombined. As the hole and the electron are recombined, an exciton having high energy may be generated. When the excitons with high energy fall into a low energy state, the excitons may emit light while emitting energy.

For example, the EML 113 may emit blue based light, which may be referred to as blue light. The EML 113 may be formed of at least one of a blue quantum dot electroluminescent device, a blue fluorescent electroluminescent device, a blue thermally activated delayed fluorescent electroluminescent device, and a blue phosphorescent electroluminescent device.

Figure 3:
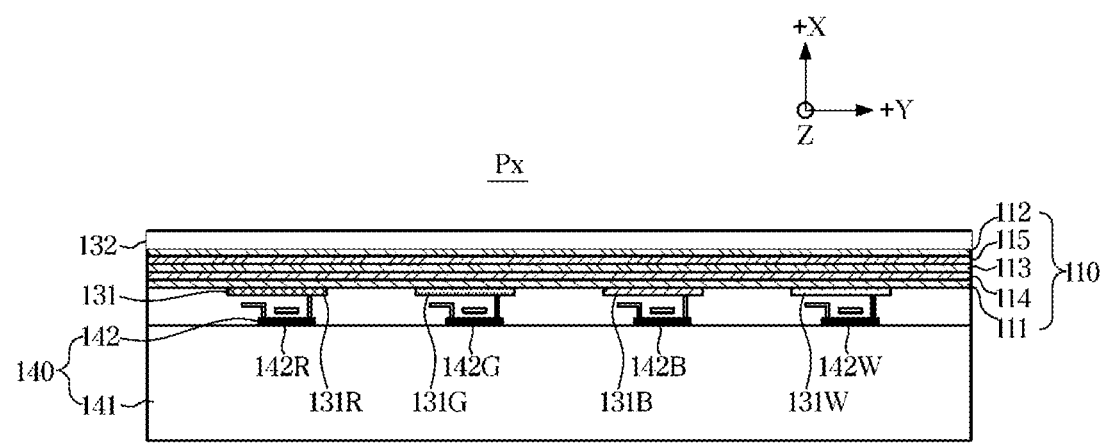
FIG. 3 is a view illustrating a structure of a single pixel included in the display panel according to an embodiment.

FIG. 3 is a view illustrating a structure of a single pixel included in the display panel according to an embodiment.

According to an embodiment, the display panel 100 is composed of a plurality of pixels in a two-dimensional array. A single pixel, which is one of the plurality of pixels, includes a red sub-pixel for outputting red light, a green sub-pixel for outputting green light, a blue sub-pixel for outputting blue light, and a white sub-pixel for outputting white light.

Referring to FIG. 3, the anode 131 injecting holes into the EML 113 may include a red pixel electrode 131R corresponding to the red sub-pixel, a green pixel electrode 131G corresponding to the green sub-pixel, a blue pixel electrode 131B corresponding to the blue sub-pixel, and a white pixel electrode 131W corresponding to a white sub-pixel.

The red pixel electrode 131R, the green pixel electrode 131G, the blue pixel electrode 131B and the white pixel electrode 131W may be contained in one unit pixel (Px).

In addition, the red pixel electrode 131R and various components directly or indirectly connected thereto may form a red sub-pixel, the green pixel electrode 131G and various components directly or indirectly connected thereto may form a green sub-pixel, and the blue pixel electrode 131B and various components directly or indirectly connected thereto may form a blue sub-pixel. The white pixel electrode 131W and various components directly or indirectly connected thereto may form a white sub-pixel.

According to an embodiment, each of the pixel electrodes 131R, 131G, 131B, and 131W may be formed of a metal electrode such as silver (Ag) or aluminum (Al), or may be implemented as a transparent electrode.

A thin film transistor (TFT) array 140 may be located behind the anode 131. The TFT array 140 may include a substrate 141 and a plurality of TFTs 142 arranged on the substrate 141 in a two-dimensional matrix form. The plurality of TFTs 142 may be provided at positions corresponding to the respective pixel electrodes 131R, 131G, 131B, and 131W.

The TFT 142 may be composed of a gate, a source, and a drain. The TFT 142 may be electrically connected to each of the pixel electrodes 131R, 131G, 131B, and 131W to supply a current. The red pixel electrode 131R is connected to a red pixel TFT 142R and the green pixel electrode 131G is connected to a green pixel TFT 142G and the blue pixel electrode 131B is connected to a blue pixel TFT 142B and the white pixel electrode 131W is connected to a white pixel TFT 142W and thus the red pixel electrode 131R, the green pixel electrode 131G, the blue pixel electrode 131B and the white pixel electrode 131W may be driven independently of each other.

Accordingly, on/off control or brightness control of the red sub-pixel, the green sub-pixel, the blue sub-pixel, and the white sub-pixel may be independently performed.

Figure 4:
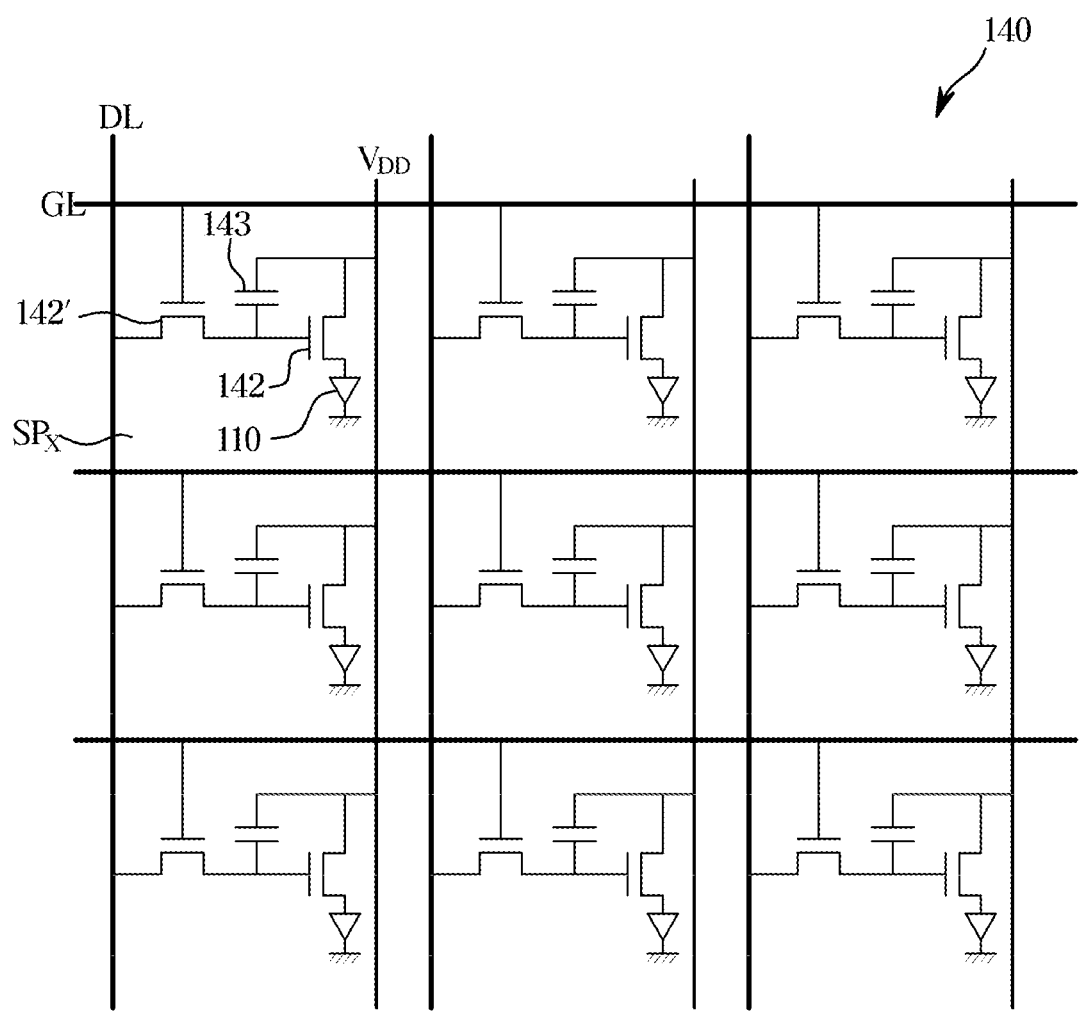
FIG. 4 is a circuit diagram schematically illustrating a circuit configuration of a TFT array according to an embodiment.

FIG. 4 is a circuit diagram schematically illustrating a circuit configuration of the TFT array 140. The display panel 100 may be driven independently of units of sub-pixels. Therefore, a circuit of the TFT array 140 may also be provided in units of sub-pixels (SPx).

Each sub-pixel SPx may include a switching TFT 142' configured to determine whether to receive a voltage that is whether to turn on or turn off a pixel and a driving TFT 142 configured to determine an amount of current to be transmitted to the light source 110. In an embodiment described below, the TFT 142 electrically connected to the anode 131 may represent a driving TFT, or may represent a TFT including both a switching TFT and a driving TFT.

A gate line (GL) for controlling turning on/off of the switch TFT 142', a data line (DL) for supplying a voltage to a pixel, and a power line (VDD) for continuously supplying voltage during a single frame may be provided on the TFT array 140.

Particularly, a case in which a voltage of 15 V is supplied from the power line VDD and a voltage of 10 V is applied to the data line DL will be described as an example. When a voltage of 10V is applied to the data line DL, the gate line GL transmits an on-signal to the switching TFT 142'. When the switching TFT 142' is turned on, the voltage of the data line DL is applied to a pixel. Because a voltage of 15 V of the power line VDD and a voltage of 10V of the data line DL are applied in an opposite direction to each other, a voltage of 5V is stored in a capacitor 143 and a current, which is to be applied by the driving TFT 142, is determined according to the voltage stored in the capacitor 143. For example, the driving TFT 142 may apply a current of 1 µA to the light source 110, and the light source 110 emits light corresponding to the applied current.

Figure 25:
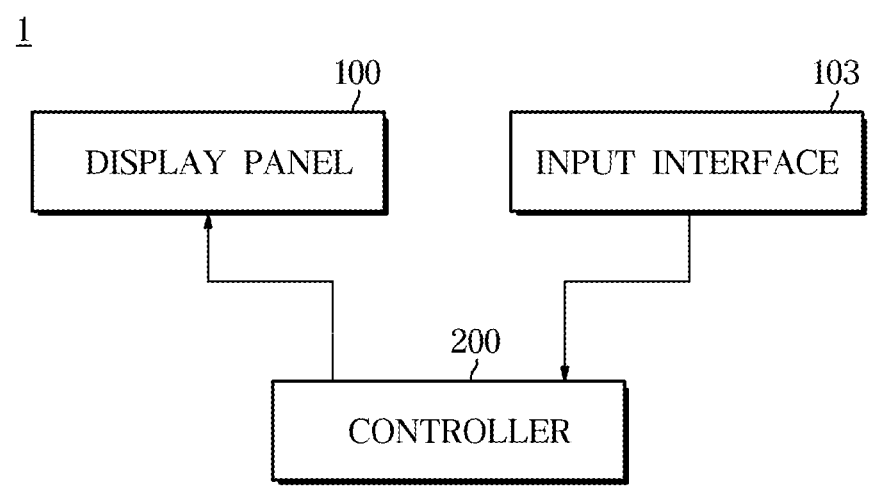
FIG. 25 is a control block diagram illustrating the display apparatus according to an embodiment.

A controller 200, as illustrated for example in FIG. 25, configured to control the display panel 100 may select an on/off state and a current application amount of each sub-pixel according to an image signal to be output. The controller 200 may output a desired image by applying an on/off signal and a voltage signal through the gate line GL and the data line DL.

Referring again to FIG. 3, according to an embodiment the light source 110 having the above-described structure is arranged in front of the anode 131, and the cathode 132 is arranged in front of the light source 110. The cathode 132 may be implemented by a transparent electrode for transmitting light emitted from the light source 110, and the cathode 132 may be formed of a material such as indium-tin oxide (ITO).

Figure 5:
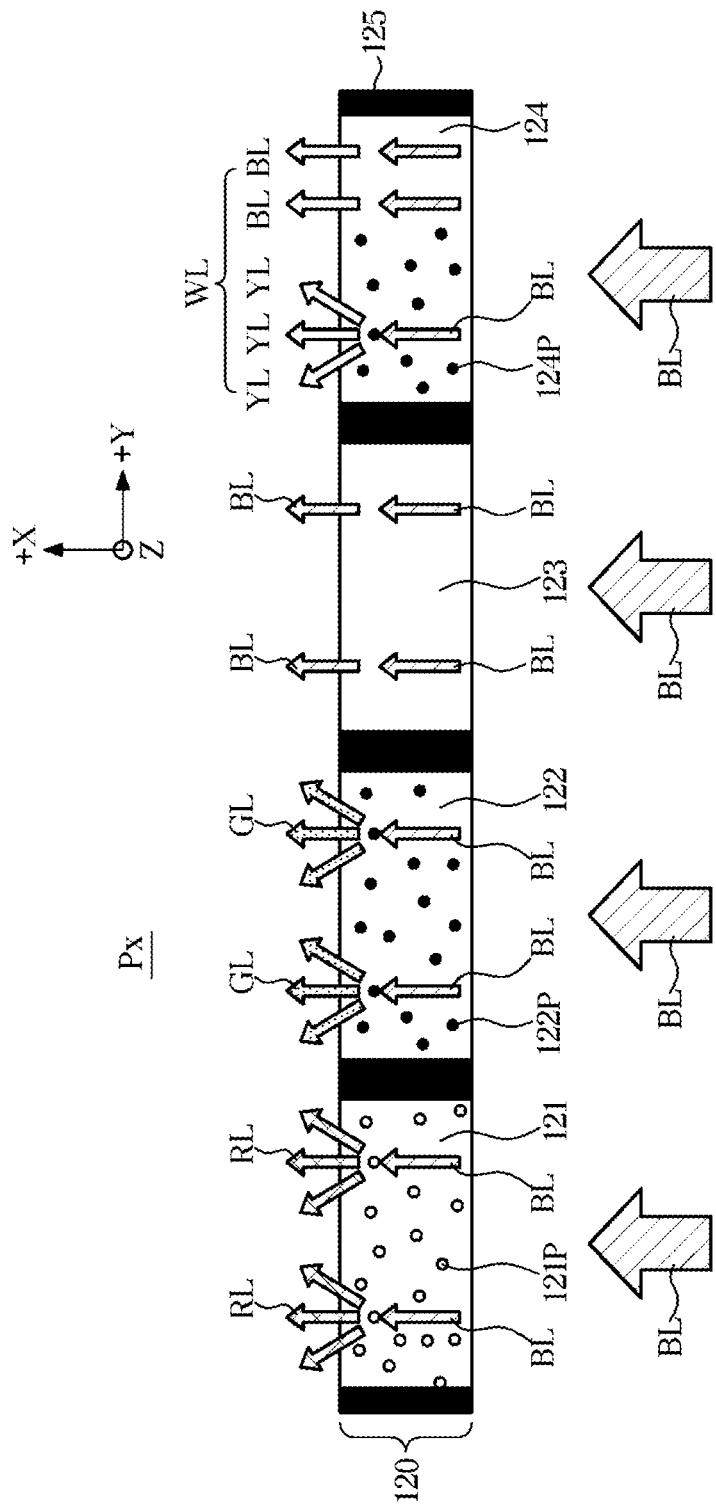
FIG. 5 is a cross-sectional side view illustrating a structure of a color filter layer used in the display panel according to an embodiment.

FIG. 5 is a cross-sectional side view illustrating a structure of a color filter layer used in the display panel according to an embodiment.

Referring to FIG. 5, the blue light BL emitted from the light source 110 may be incident on a quantum dot color filter layer 120 arranged in front of the light source 110, and the quantum dot color filter layer 120 may convert the blue light BL into red light RL, yellow light YL, and green light GL and output the red light RL, the yellow light YL, and the green light GL or the quantum dot color filter layer 120 may output the blue light BL without color conversion.

The quantum dot color filter layer 120 may include a red light converter 121 configured to convert incident light into red using a quantum dot (QD), a green light converter 122 configured to convert incident light into green, a light transmitting portion 123 configured to transmit light, and a white light generator 124 configured to generate white light using incident light.

By using a method in which a wavelength of a desired color is transmitted and remaining wavelengths are absorbed to implement a specific color, photon loss may occur, which may lead to a decrease in efficiency, a high power consumption, and deterioration in life. On the other hand, by using a quantum dot for converting incident light into light of a desired color, which may be used in the display panel 100 according to an embodiment, such a photon loss does not occur and thus it is possible to obtain a relatively excellent efficiency and to prevent a high power consumption and deterioration in life.

The quantum dot may refer to a semiconductor crystal formed by collecting hundreds to thousands of atoms. For example, the size of the quantum dot may be from several nanometers to tens of nanometers. Thus, the quantum confinement effect occurs because the quantum dots are very small in size.

The quantum confinement effect may refer to an effect in which that electrons in a particle form a discontinuous energy state due to the outer wall of the particle when the particle is very small and as the space in the particle is smaller, the energy state of the electron becomes relatively higher and the energy band gap becomes wider.

According to such a quantum confinement effect, a quantum dot can generate light in a wide range of wavelengths when light such as ultraviolet rays or visible light is incident. In this case, the quantum dot scatters incident light and emits the light.

The length of the wavelength of the light generated in the quantum dot may vary in accordance with the particle size. Particularly, when light having a wavelength greater than the energy band gap is incident on the quantum dot, the quantum dot absorbs the energy of the light and is excited, and becomes a ground state while emitting light of a specific wavelength.

As the size of the quantum dots is relatively small, the quantum dots generate light having a relatively short wavelength such as blue-based light or green-based light. As the size of the quantum dots is relatively big, the quantum dots generate light having a relatively long wavelength such as red-based light. Therefore, it is possible to implement light of various colors according to the size of the quantum dot.

Hereinafter quantum dot particles capable of converting incident light into green-based light are referred to as green quantum dot particles, quantum dot particles capable of converting incident light into red-based light are referred to as red quantum dot particles, and quantum dot particles capable of converting incident light into yellow-based light are referred to as yellow quantum dot particles.

In the following embodiments, the red-based light is referred to as red light, the green-based light is referred to as green light, the blue-based light is referred to as blue light, and the yellow-based light is referred to as yellow light.

As an example, a green quantum dot particle may be a particle having a width of from about 2 nm to about 3 nm, and a red quantum dot particle may be a particle having a width of from about 5 nm to about 6 nm. As an example, a yellow quantum dot particle may be a particle having a width of from about 3 nm to about 4 nm.

According to an embodiment, a red light converter 121 includes a plurality of red quantum dot particles 121P, the green light converter 122 includes a plurality of green quantum dot particles 122P, and the white light generator 124 includes a plurality of yellow quantum dot particles 124P. The size of the red quantum dot particles 121P in the red light converter 121 may be relatively larger than the size of the green quantum dot particles in the green light converter 122. The size of the yellow quantum dot particles 124P may be relatively larger than the size of the green quantum dot particles 122P, and may be relatively smaller than the red quantum dot particles 121P.

In order to separate cells of the red light converter 121, the green light converter 122, the light transmitting portion 123 and the white light generator 124, a partition 125 may be arranged in a boundary among the red light converter 121, the green light converter 122, the light transmitting portion 123, and the white light generator 124. The partition 125 may block the movement of light between the cells and improve the contrast. The partition 125 arranged between the red light converter 121 and the green light converter 122 may be a first partition, the partition 125 arranged between the green light converter 122 and the light transmitting portion 123 may be a second partition, the partition 125 may be a third partition arranged between the light transmitting portion 123 and the white light generator 124 in order to distinguish each other, A detailed description of an example of the partition 125 will be described later.

When the blue light BL emitted from the light source 110 is incident on the red light converter 121, the red quantum dot particle 121P may convert the incident blue light BL into the red light RL. The red light RL may be scattered and emitted in various directions.

When the blue light BL emitted from the light source 110 is incident on the green light converter 122, the green quantum dot particles 122P may convert the incident blue light BL into the green light GL. The green light GL may be scattered and emitted in various directions.

The light transmitting portion 123 may be formed of a light transmitting material capable of transmitting incident light. Alternatively, the light transmitting portion 123 may be an empty space through which the incident light passes without change.

The light transmitting material may include a material having transparency of a certain level or higher such as natural resin or synthetic resin, e.g., resin and glass. The synthetic resin may include an epoxy resin, a urethane resin, an acryl-nitrile butadiene styrene (ABS), a polycarbonate or a polymethyl methacrylate (PMMA). The glass may include silicate glass, borate glass and phosphate glass. In addition, a transparent material capable of transmitting various kinds of light that can be considered by a designer may be used as a light transmitting material.

When the blue light BL emitted from the light source 110 is incident on the white light generator 124, the yellow quantum dot particles 124P may convert the incident blue light BL into the yellow light YL. The yellow light YL may be scattered and emitted in various direction.

As described above, by applying a method in which blue light is emitted from the light source 110 and the color filter layer 120 converts the blue light into a desired color, it is possible to obtain improved efficiency in comparison with a case in which white light is emitted from the light source and the color filter layer absorbs colors except for a specific wavelength.

In an embodiment, the white light generator 124 may comprise a first region and a second region. The first region may comprise a plurality of yellow quantum dot particles configured to convert the blue light into yellow light and the second region may transmit the blue light. Accordingly, some beams of the blue light beams BL incident on the white light generator 124 may be converted into the yellow light YL, and the remaining beams of the blue light beams BL may be emitted without conversion. Accordingly, the yellow light YL and the blue light BL emitted from the white light generator 124 are mixed to generate the white light WL.

It is possible to maintain the yellow quantum dot particles 124P at a relatively low concentration in comparison with a concentration of the quantum dot particles in the red light converter 121 or the green light converter 122 because the white light generator 124 converts some beams of the incident blue light beams into the yellow light YL. Therefore, it is possible to suppress the re-absorption of the converted light, which occurs when a distance between the quantum dot particles is narrow, and it is possible to reduce the efficiency loss due to the re-absorption of the converted light.

Figure 6:
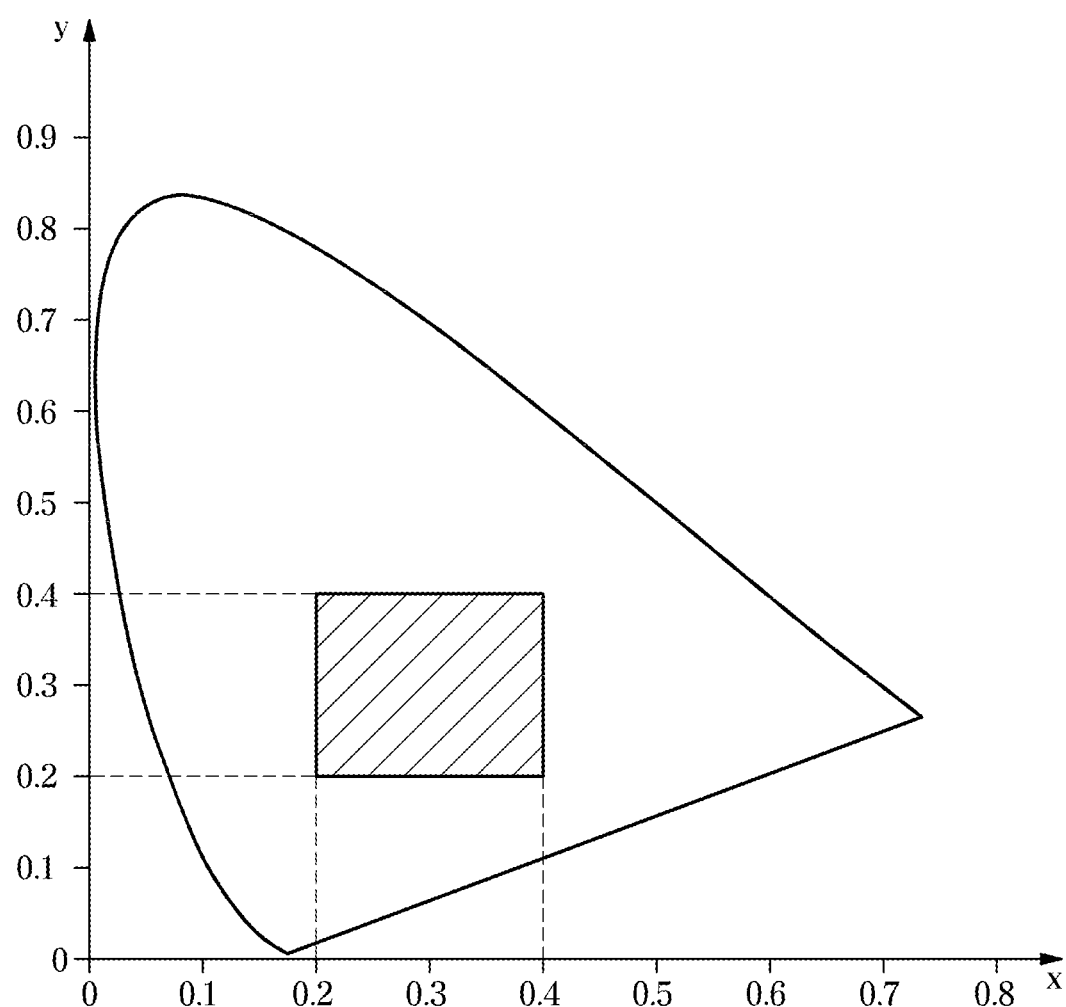
FIG. 6 is a view illustrating a position of white light, which is generated by a white light generator, on a chromaticity diagram according to an embodiment.

FIG. 6 is a view illustrating a position of white light, which is generated by a white light generator, on the chromaticity diagram. The chromaticity diagram of FIG. 6 is defined based on the CIE 1931 color space.

For example, the white light generated by the white light generator 124 may be located in the range of x value of 0.2 to 0.4 and y value of 0.2 to 0.4 on the chromaticity diagram, as illustrated in FIG. 6.

The white light generated by the white light generator 124 is a mixture of yellow light and blue light. Accordingly, the chromaticity of the light generated by the white light generator 124 may vary depending on the ratio of the yellow light and the blue light. The yellow light is converted by the yellow quantum dot particles 124P and thus the chromaticity of the light generated by the white light generator 124 may vary according to the concentration of the yellow quantum dot particles 124P in the white light generator 124. Accordingly, it is possible to generate white light having x value in the range of 0.2 to 0.4 and y value in the range of 0.2 to 0.4 on the chromaticity diagram by adjusting the concentration of the yellow quantum dot particles 124P in the white light generator 124.

Figure 7:
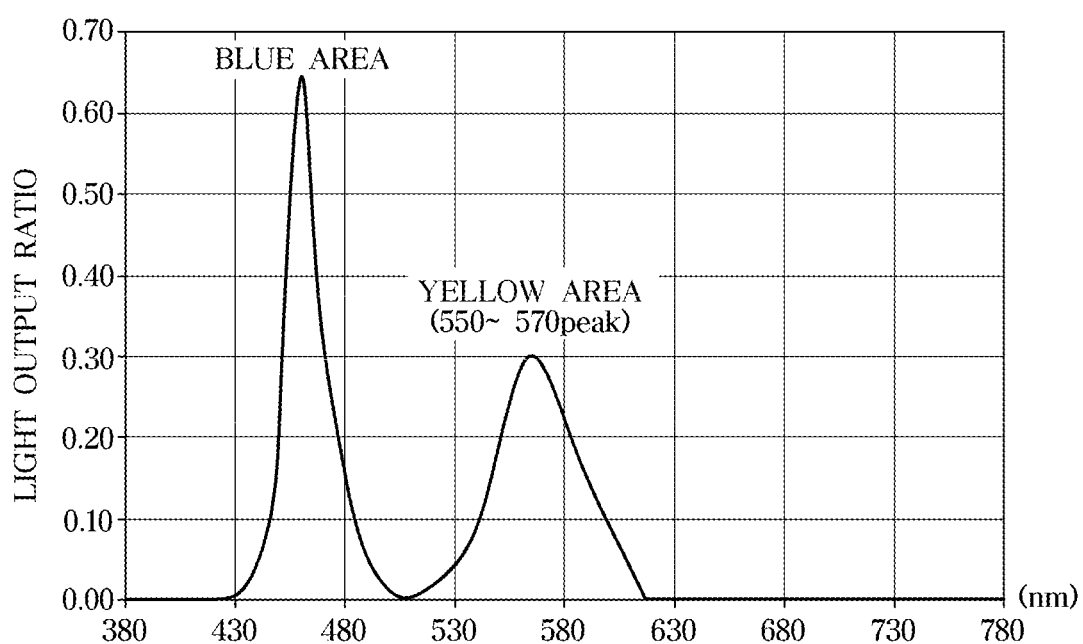
FIG. 7 is a view illustrating a spectrum of light outputted from a white sub-pixel of the display panel according to an embodiment.
Figure 8:
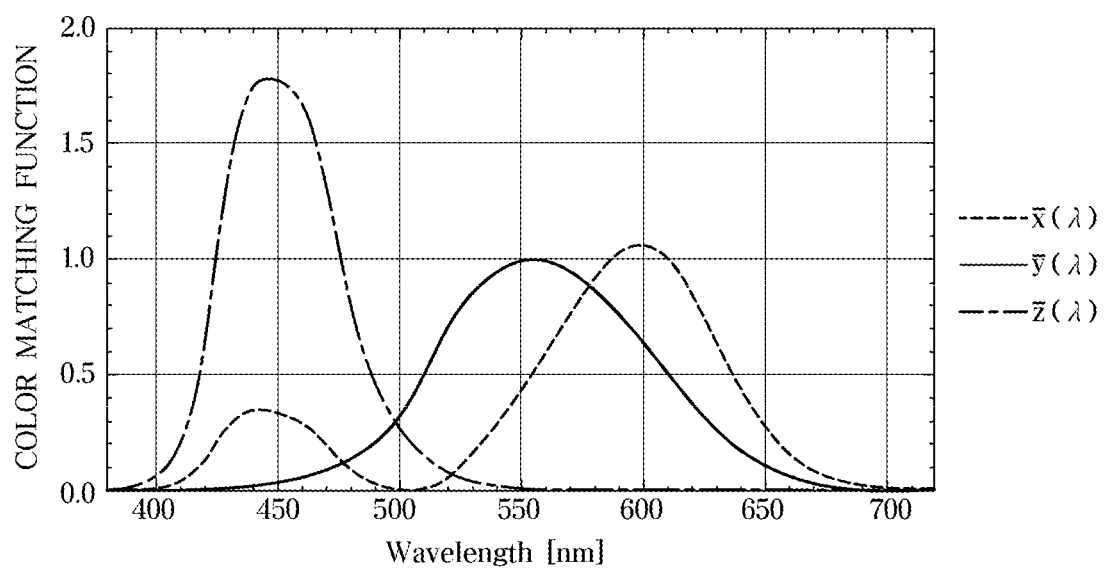
FIG. 8 is a graph illustrating the color matching function according to an embodiment.

FIG. 7 is a view illustrating a spectrum of light outputted from a white sub-pixel of the display panel according to an embodiment. FIG. 8 is a graph illustrating the color matching function according to an embodiment.

As described above, the blue light BL emitted from the white light generator 124 is a component that is directly emitted without being absorbed by the quantum dots. Therefore, photon loss due to absorption of the quantum dots does not occur in the blue light BL emitted from the white light generator 124.

Referring to FIG. 7, it can be seen that the light output efficiency of the blue light BL is higher than the yellow light YL that is emitted after being absorbed by the yellow quantum dot particles 124P. The light output efficiency represents the ratio between the incident light and the output light.

Therefore, in comparison with other sub-pixels, it is possible to obtain relatively excellent average light output efficiency in the white sub-pixel.

Meanwhile, in the display panel 100 according to an embodiment, the yellow light YL emitted from the white light generator 124 may have a peak wavelength in a range of 540 nm to 580 nm. For this purpose, it is possible to adjust the size of the yellow quantum dot particles 124P to convert the incident blue light BL into light having a peak wavelength in the range of 540 nm to 580 nm.

The graph of FIG. 8 represents a color matching function defined based on the CIE 1931 color space. The color matching function is the numerical description of the chromatic response of the standard observer.

Referring to the graph of FIG. 8, it can be seen that a wavelength region of 540 nm to 580 nm is a region having a high visibility. In particular, the visibility is the highest in the wavelength range of 550 nm to 580 nm. The visibility is a value indicating the degree to which the energy of electromagnetic waves is felt as light. Therefore, as the visibility is high, it is possible to emit light having the higher brightness with the same photon amount.

When white light is generated by mixing red light, green light and blue light, light of 530 nm and 630 nm wavelength band having low visibility is used. On the other hand, when white light is generated by mixing yellow light YL and blue light BL having a peak wavelength in the range of 540 nm to 580 nm like the display panel 100 according to an embodiment, it is possible to realize more excellent brightness with the same photon amount, than when white light is generated by mixing red light, green light and blue light.

When white light is generated by mixing red light, green light and blue light, that is, when one single pixel is composed of a red sub-pixel, a green sub-pixel, and a blue sub-pixel, the red-sub pixel, the green sub-pixel, and the blue sub-pixel of the single pixel emit red light, green light and blue light, respectively to implement white color and thus three different light having different wavelength are mixed in the white light.

At this time, the red light, the green light, and the blue light may be emitted in substantially equal amounts in each sub-pixel, but because of a time difference between the emission of the red light, the green light, and the blue light, the white light generated in the single pixel may be emitted unevenly. Accordingly, a user may have difficulties in recognizing the white area in that a stain may be perceived on a white area displayed on the display panel. However, by providing a separate white light generator 124, which is configured to generate white light, in a single pixel like the display panel 100 according to an embodiment, it is possible to improve the uniformity of white color displayed on the display apparatus 1.

Figure 9:
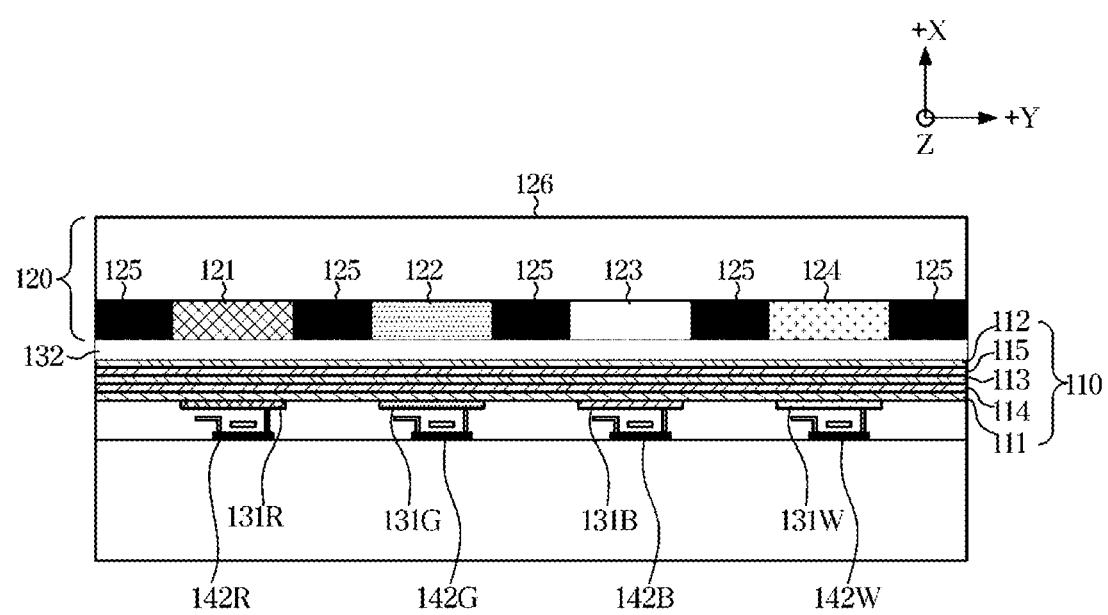
FIG. 9 is a cross-sectional view illustrating a structure of the display panel according to an embodiment.

FIG. 9 is a cross-sectional view illustrating a structure of the display panel according to an embodiment, and FIGS. 10 to 13 are views illustrating a process of outputting red light, green light, blue light and white light from the display panel according to an embodiment.

The red light converter 121, the green light converter 122, the light transmitting portion 123, the white light generator 124 and the partition 125 provided at the boundary between them, which are described above with reference to FIG. 5, may be formed on a color filter substrate 126 as illustrated in FIG. 9.

The color filter substrate 126 may be positioned in front of the red light converter 121, the green light converter 122, the light transmitting portion 123, the white light generator 124 and the partition 125 provided at the boundary between them. The color filter substrate 126 is formed of a transparent material to allow light, which is emitted from the red light converter 121, the green light converter 122, the light transmitting portion 123, and the white light generator 124, to be output to the outside.

The light source 110, the anode 131 and the cathode 132 configured to supply holes and electrons to the light source 110, and the TFT array 140 configured to control each sub-pixel, which are described above with reference to FIG. 3, may be arranged behind the quantum dot color filter layer 120.

Particularly, the TFT 142 serving as a switch configured to control each sub-pixel is formed on the substrate 141. Each TFT 142 may be formed at a position corresponding to the corresponding sub-pixel.

Pixel electrodes corresponding to the respective sub-pixels are arranged in front of the TFT array 140, and the pixel electrodes are electrically connected to the TFT 142 corresponding to the respective sub-pixels. As described above, the anode 131 includes the red pixel electrode 131R corresponding to the red sub-pixel, the green pixel electrode 131G corresponding to the green sub-pixel, the blue pixel electrode 131B corresponding to the blue sub-pixel, and a white pixel electrode 131W corresponding to a white sub-pixel.

The red pixel electrode 131R is electrically connected to the red TFT 142R configured to control the red sub-pixel, the green pixel electrode 131G is electrically connected to the green TFT 142G configured to control the green sub-pixel, and the blue pixel electrode 131B is electrically connected to the blue TFT 142B configured to control the blue sub-pixel. Further, the white pixel electrode 131W is electrically connected to the white TFT 142W configured to control the white sub-pixel.

The cathode 132 is positioned in front of the anode 131, and the light source 110 is arranged between the anode 131 and the cathode 132. When the TFT 142 configured to control each sub-pixel is turned on, the anode 131 supplies a current to the light source 110 and the cathode 132 supplies electrons to the light source 110 and thus the light source 110 emits light.

Among the blue light beams BL emitted from the light source 110, light beams incident on the red light converter 121 of the quantum dot color filter layer 120 are converted into the red light RL, light beams incident on the green light converter 122 are converted into the green light RL, and light beams incident on the light transmitting portion 123 may be output as the blue light BL without conversion. As for light beams incident on the white light generator 124, some beams of the light beams are converted into the yellow light YL. The yellow light YL is mixed with the blue light BL, which is not converted, to generate the white light WL.

The red light RL output from the red light converter 121, the green light GL output from the green light converter 122, the blue light BL output from the light transmitting portion 123, and the white light WL output from the white light generator 124 may be output to the outside through the color filter substrate 126 that is transparent. Hereinafter examples of a process of outputting the red light RL, the green light GL, the blue light BL, and the white light WL will be described in detail.

Figure 10:
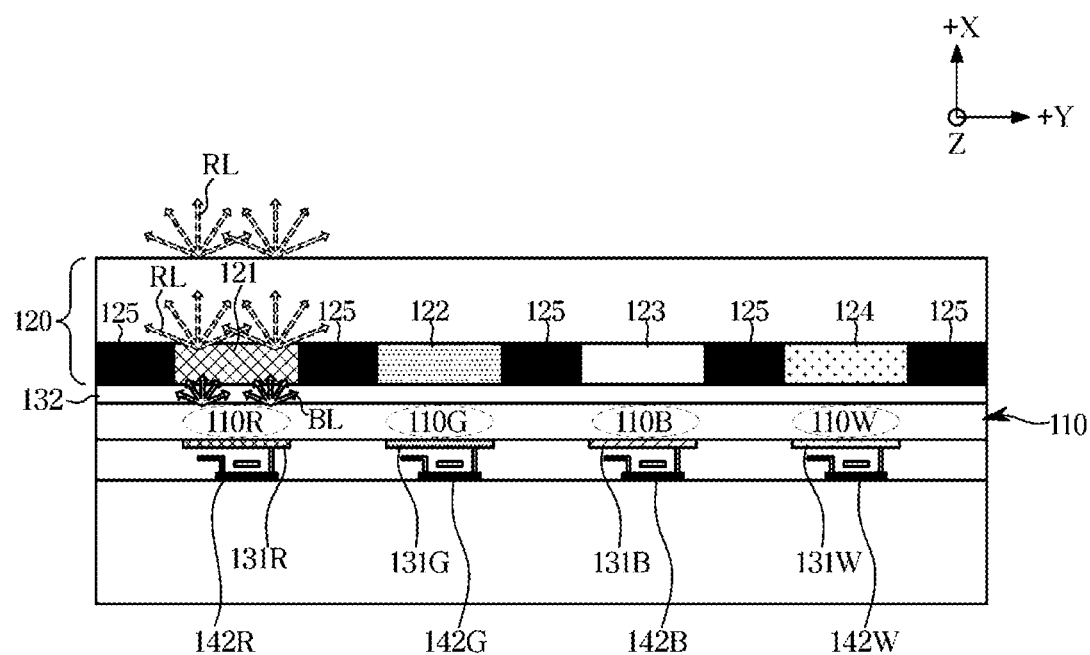
FIG. 10 is a view illustrating a process of outputting red light from the display panel according to an embodiment.

As illustrated in FIG. 10, the light source 110 may be divided into a red sub-pixel region 110R, a green sub-pixel region 110G, a blue sub-pixel region 110B, and a white sub-pixel region 110W.

The red sub-pixel region 110R may be a region where a current is received from the red pixel electrode 131R to emit light, the green sub-pixel region 110G may be a region where a current is received from the green pixel electrode 131G to emit light, and the blue sub-pixel region 110B may be a region where a current is received from the blue pixel electrode 131B to emit light. Further, the white sub-pixel region 110W may be a region where a current is received from the white pixel electrode 131W to emit light. The current supplied to the red sub-pixel may be a first current, the current supplied to the green sub-pixel may be a second current, the current supplied to the blue sub-pixel may be a third current and the current supplied to the white sub-pixel may be a fourth current in order to distinguish each current.

Each of the sub-pixel regions 110R, 110G, 110B, and 110W may be spaced apart from each other or overlapping each other and the boundaries thereof may be in contact with each other.

The red TFT 142R, the red pixel electrode 131R, the red sub-pixel region 110R and the red light converter 121 may implement the red sub-pixel and the green TFT 142G, the green pixel electrode 131G, the green sub-pixel region 110G and the green light converter 122 may implement the green sub-pixel, and the blue TFT 142B, the blue pixel electrode 131B, the blue sub-pixel region 110B and the light transmitting portion 123 may implement the blue sub-pixel. Further, the white TFT 142W, the white pixel electrode 131W, the white sub-pixel region 110W and the white light generator 124 may implement the white sub-pixel.

According to an embodiment, when the red sub-pixel is turned on, the red TFT 142R applies a current to the red sub-pixel region 110R through the red pixel electrode 131R and the red sub-pixel region 110R emits the blue light BL by the applied current.

According to an embodiment, the fact that the sub-pixel is turned on may mean that the controller 200 of the display apparatus 1, as illustrated for example in FIG. 25, inputs the on signal to the gate line of the TFT array 140 so that a current is supplied to the light source 110 through the pixel electrode of the corresponding sub-pixel.

The blue light BL emitted from the red sub-pixel region 110R is transmitted through the transparent cathode 132 and incident on the red light converter 121. The red sub-pixel region 110R means a region corresponding to the red light converter 121 and the red pixel electrode 131R and thus the red sub-pixel region 110R may emit light toward the red light converter 121.

The red quantum dot particles 121P of the red light converter 121 convert the incident blue light BL into the red light RL, and the red light RL may be output to the outside by passing through the transparent color filter substrate 126.

Figure 11:
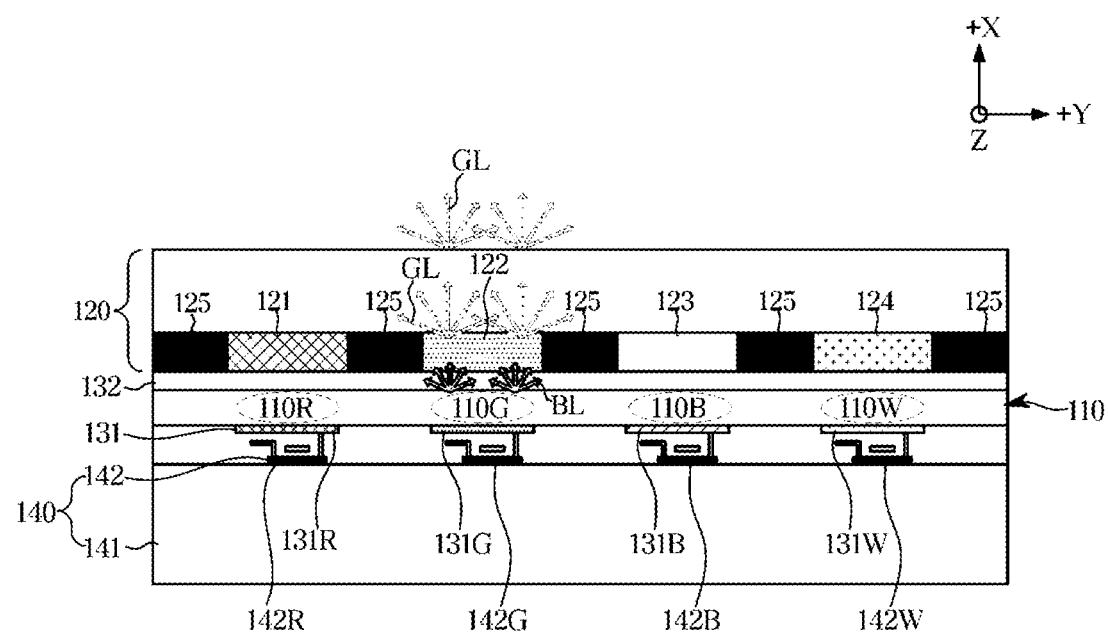
FIG. 11 is a view illustrating a process of outputting green light from the display panel according to an embodiment.

According to an embodiment, referring to FIG. 11, when the green sub-pixel is turned on, the green TFT 142G applies a current to the green sub-pixel region 110G through the green pixel electrode 131G, and the green sub-pixel region 110G emits the blue light BL by the applied current.

The blue light BL emitted from the green sub-pixel region 110G is transmitted through the transparent cathode 132 and incident on the green light converter 122. The green sub-pixel region 110G means a region corresponding to the green light converter 122 and the green pixel electrode 131G, and thus the green sub-pixel region 110G may emit light toward the green light converter 122.

The green quantum dot particles 122P of the green light converter 122 convert the incident blue light BL into the green light GL, and the green light GL may be output to the outside by passing through the transparent color filter substrate 126.

Figure 12:
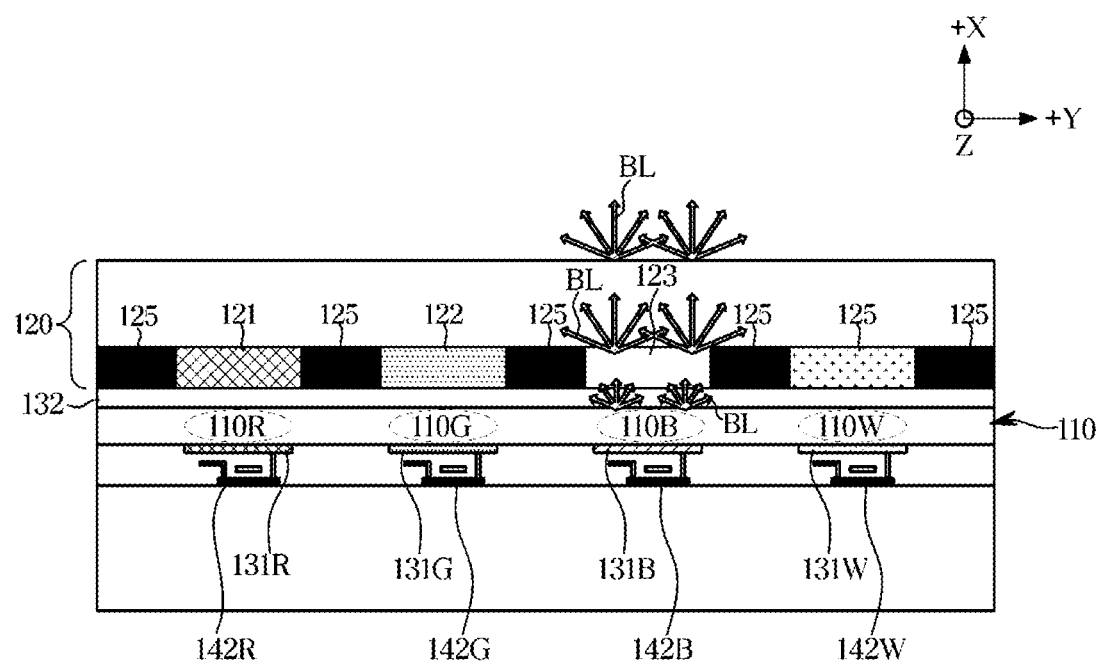
FIG. 12 is a view illustrating a process of outputting blue light from the display panel according to an embodiment.

According to an embodiment, referring to FIG. 12, when the blue sub-pixel is turned on, the blue TFT 142B applies a current to the blue sub-pixel region 110B through the blue pixel electrode 131B, and the blue sub-pixel region 110B emits the blue light BL by the applied current.

The blue light BL emitted from the blue sub-pixel region 110B is transmitted through the transparent cathode 132 and incident on the light transmitting portion 123. The blue sub-pixel region 110B means a region corresponding to the light transmitting portion 123 and the blue pixel electrode 131B, and thus the blue sub-pixel region 110B may emit light toward the light transmitting portion 123.

The blue light BL incident on the light transmitting portion 123 may be output to the outside by passing through the transparent color filter substrate 126.

Figure 13:
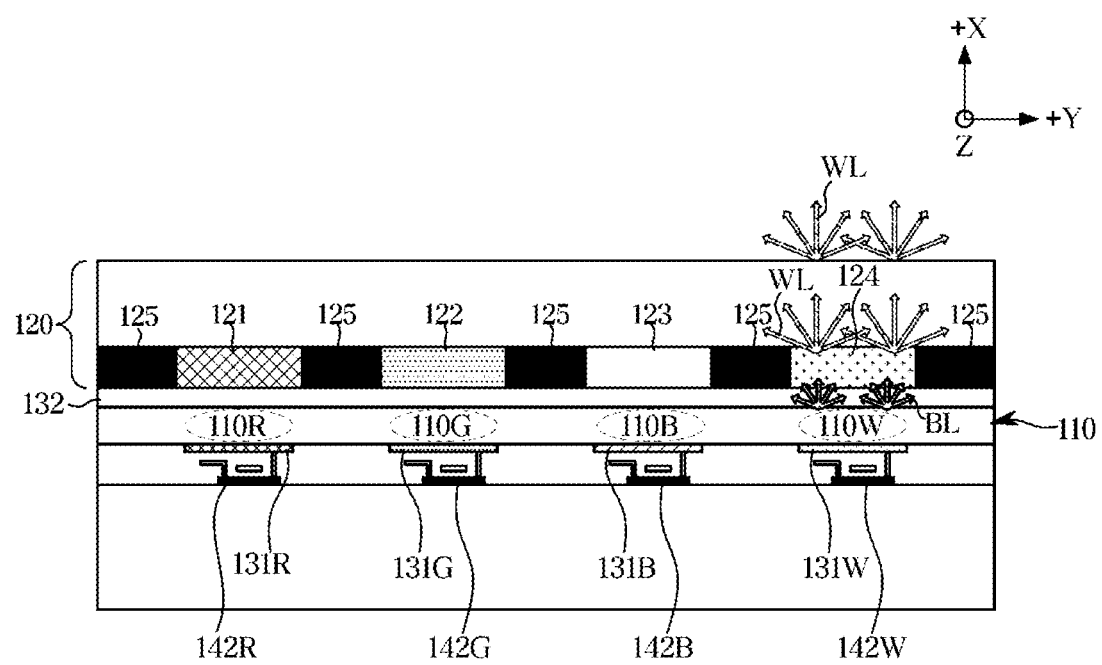
FIG. 13 is a view illustrating a process of outputting white light from the display panel according to an embodiment.

According to an embodiment, referring to FIG. 13, when the white sub-pixel is turned on, the white TFT 142W applies a current to the white sub-pixel region 110W through the white pixel electrode 131W, and the white sub-pixel region 110W emits the blue light BL by the applied current.

The blue light BL emitted from the white sub-pixel region 110W is transmitted through the transparent cathode 132 and incident on the white light generator 124. The white sub-pixel region 110W means a region corresponding to the white light generator 124 and the white pixel electrode 131W, and thus the white sub-pixel region 110W may emit light toward the white light generator 124.

The yellow quantum dot particles 124P of the white light generator 124 convert some beams of the incident blue light beams BL into the yellow light YL, and the yellow light YL may be output to the outside by passing through the transparent color filter substrate 126. The blue light beams BL, which are not absorbed by the yellow quantum dot particles 124P among the blue light beams BL incident on the white light generator 124, are transmitted through the transparent color filter substrate 126 and then output to the outside without the color conversion. While the yellow light YL and blue light BL are output together, the white light may be generated by mixing the yellow light YL with the blue light BL.

Figure 14:
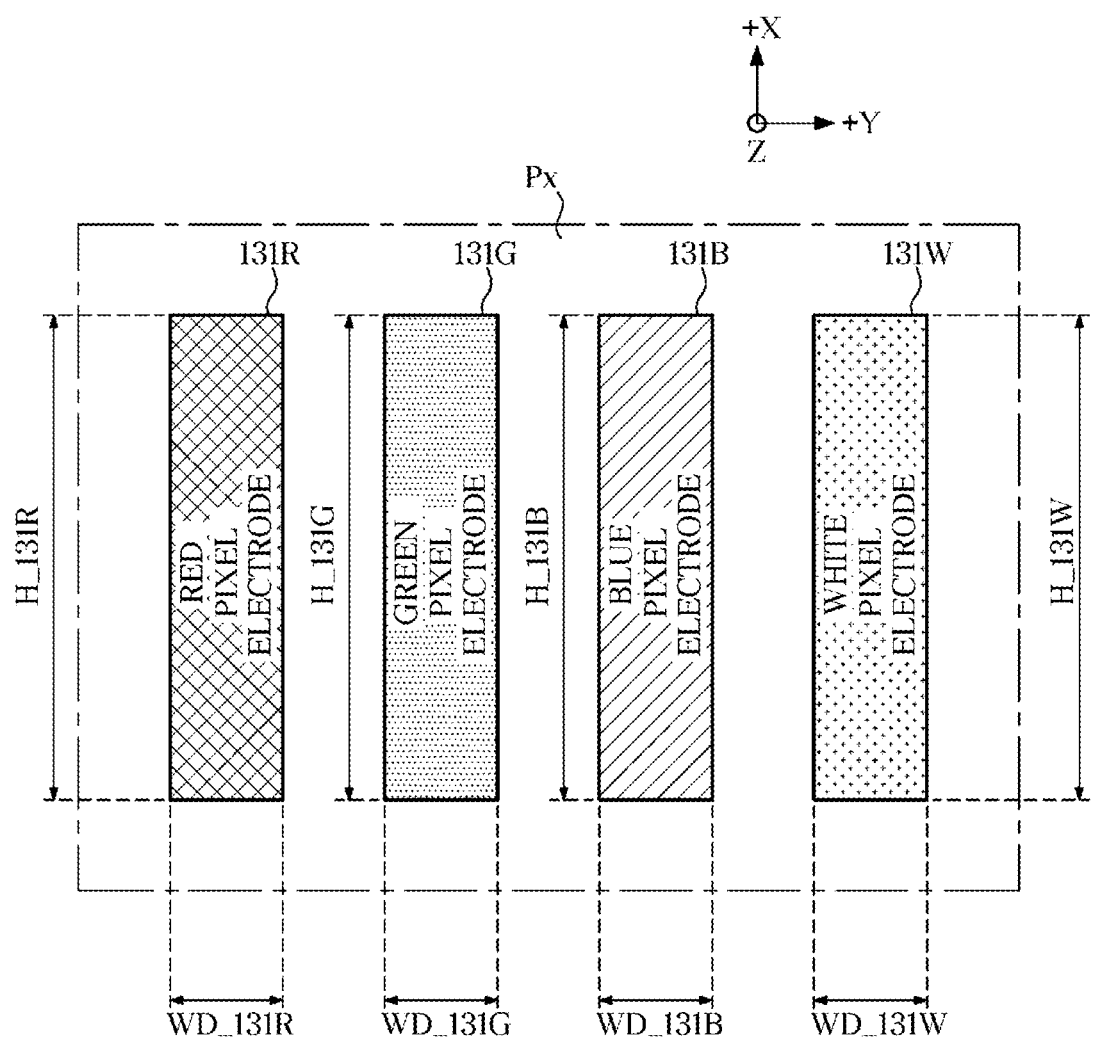
FIG. 14 is a plan view illustrating a structure of a pixel electrode included in the display panel according to an embodiment.
Figure 15:
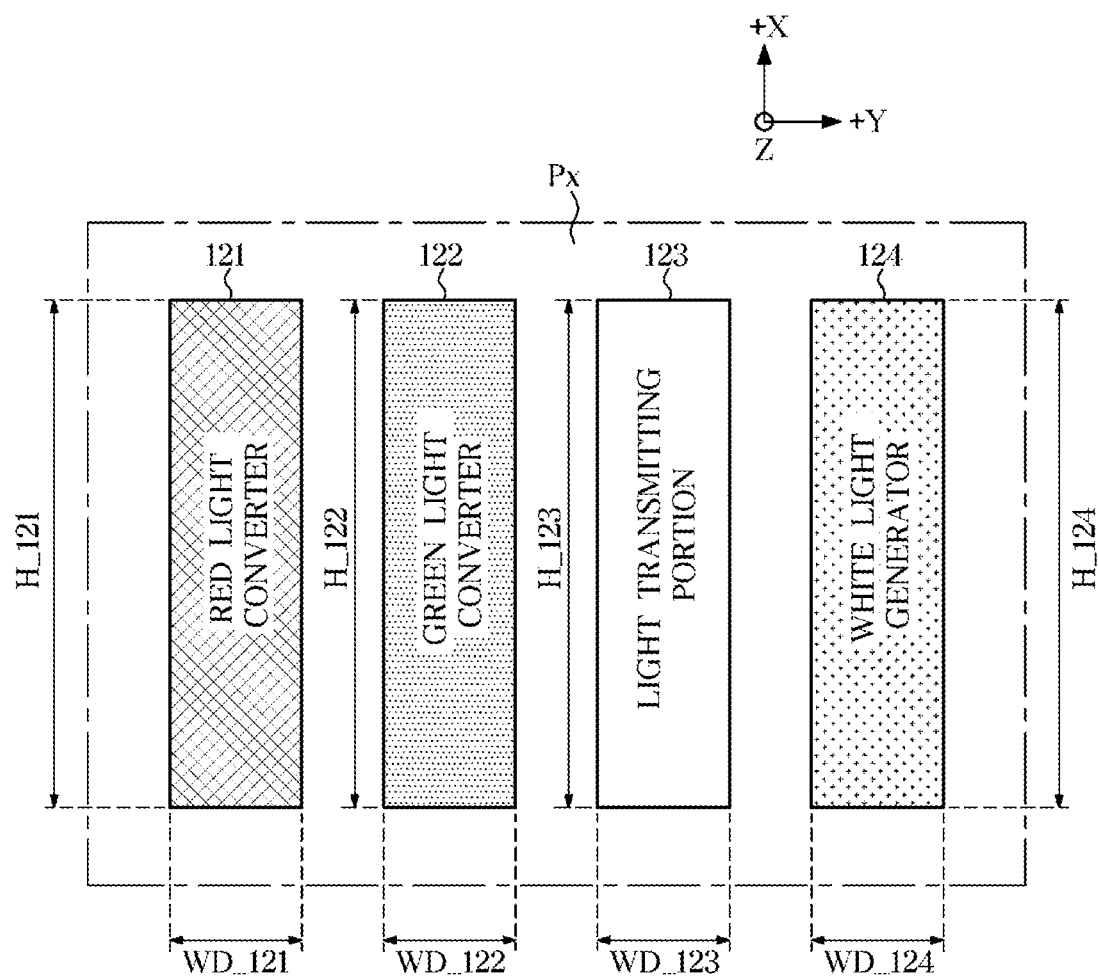
FIG. 15 is a plan view illustrating a structure of a quantum dot color filter layer included in the display panel according to an embodiment.
Figure 16:
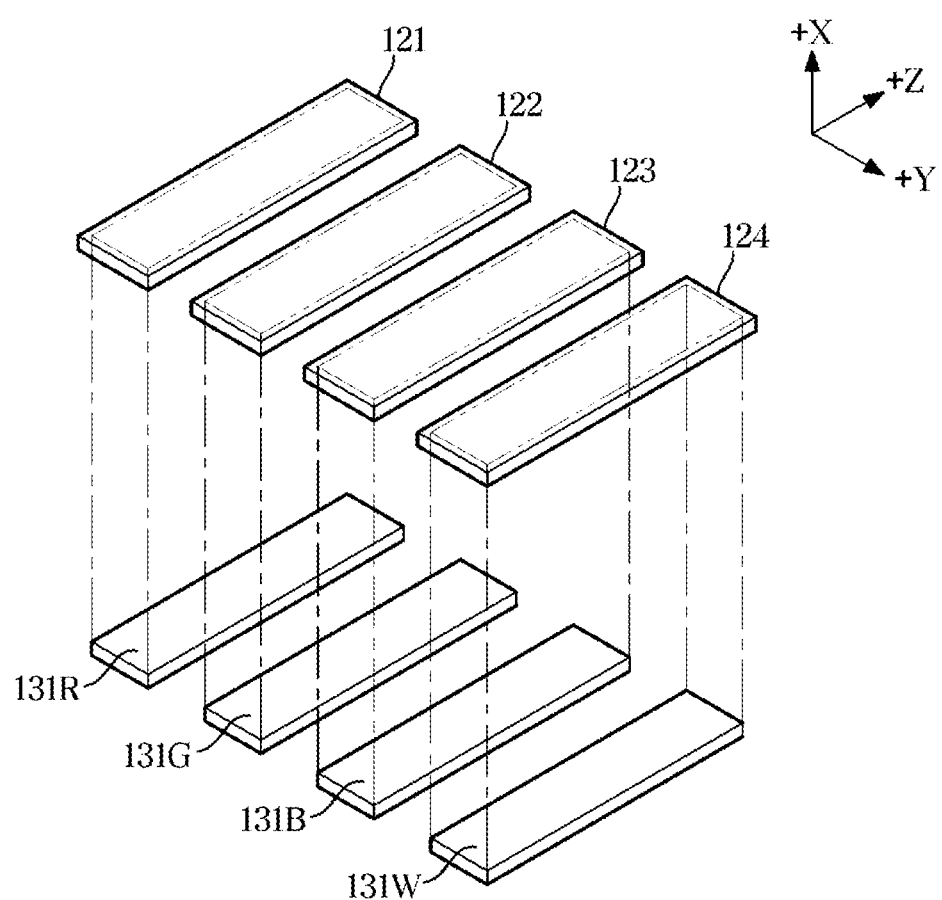
FIG. 16 is a perspective view illustrating the pixel electrode and the quantum dot color filter layer according to an embodiment.

FIG. 14 is a plan view illustrating a structure of a pixel electrode included in the display panel according to an embodiment, FIG. 15 is a plan view illustrating a structure of a quantum dot color filter layer included in the display panel according to an embodiment and FIG. 16 is a perspective view illustrating the pixel electrode and the quantum dot color filter layer.

As illustrated in FIG. 14, the red pixel electrode 131R, the green pixel electrode 131G, the blue pixel electrode 131B and the white pixel electrode 131W included in the single pixel Px may be arranged side by side. However, the arrangement of FIG. 14 is merely an example applicable to the display panel 100, and thus it should be understood that those pixel electrodes may be arranged in other arrangements.

As illustrated in FIG. 15, each of the red light converter 121, the green light converter 122, the light transmitting portion 123 and the white light generator 124 of the quantum dot color filter layer 120 may be arranged at a position corresponding to each of the red pixel electrode 131R, the green pixel electrode 131G, the blue pixel electrode 131B, and the white pixel electrode 131W. The partition 125 may be arranged on the remaining region so as to absorb or reflect the incident light.

As illustrated in FIG. 16, the quantum dot color filter layer 120 arranged in the structure of FIG. 15 may be arranged in front of the pixel electrode 131 arranged in the structure of FIG. 14. Although not shown in FIG. 16, the light source 110 and the cathode 132 may be arranged between the quantum dot color filter layer 120 and the pixel electrode 131.

Referring to FIGS. 14 to 16, each pixel electrode 131R, 131G and 131B may be implemented to have the size smaller than the red light converter 121, the green light converter 122, the light transmitting portion 123 and the white light generator 124, which are corresponding to the pixel electrodes, respectively. Therefore, it is possible to prevent that the light emitted from each sub-pixel region is incident on another adjacent sub-pixel and an unintended color mixture occurs.

More particularly, according to an embodiment, a width WD_131R of the red pixel electrode 131R is set to be smaller than a width WD_121 of the red light converter 121 and thus the light emitted from the red sub pixel region 110R may be prevented from being incident on the adjacent green light converter 122.

In addition, according to an embodiment, a height H_131R of the red pixel electrode 131R is set to be smaller than a height H_121 of the red light converter 121 and thus it is possible to prevent efficiency reduction due to output of unnecessary light.

According to an embodiment, a width WD_131G of the green pixel electrode 131G is set to be smaller than a width WD_122 of the green light converter 122 and thus the light emitted from the green sub pixel region 110G may be prevented from being incident on the adjacent red light converter 121 or the adjacent light transmitting portion 123.

In addition, according to an embodiment, a height H_131G of the green pixel electrode 131G is set to be smaller than a height H_122 of the green light converter 122, and thus it is possible to prevent efficiency reduction due to output of unnecessary light.

According to an embodiment, a width WD_131B of the blue pixel electrode 131B is set to be smaller than a width WD_123 of the light transmitting portion 123 and thus the light emitted from the blue sub pixel region 110B may be prevented from being incident on the adjacent green light converter 122 or the adjacent white light generator 124.

In addition, according to an embodiment, a height H_131B of the blue pixel electrode 131B is set to be smaller than a height H_123 of the light transmitting portion 123, and thus it is possible to prevent efficiency reduction due to output of unnecessary light.

According to an embodiment, a width WD_131W of the white pixel electrode 131W is set to be smaller than a width WD_124 of the white light generator 124 and thus the light emitted from the white sub pixel region 110W may be prevented from being incident on the adjacent light transmitting portion 123.

In addition, a height H_131W of the white pixel electrode 131W is set to be smaller than a height H_124 of the white light generator 124, and thus it is possible to prevent efficiency reduction due to output of unnecessary light.

Figure 17:
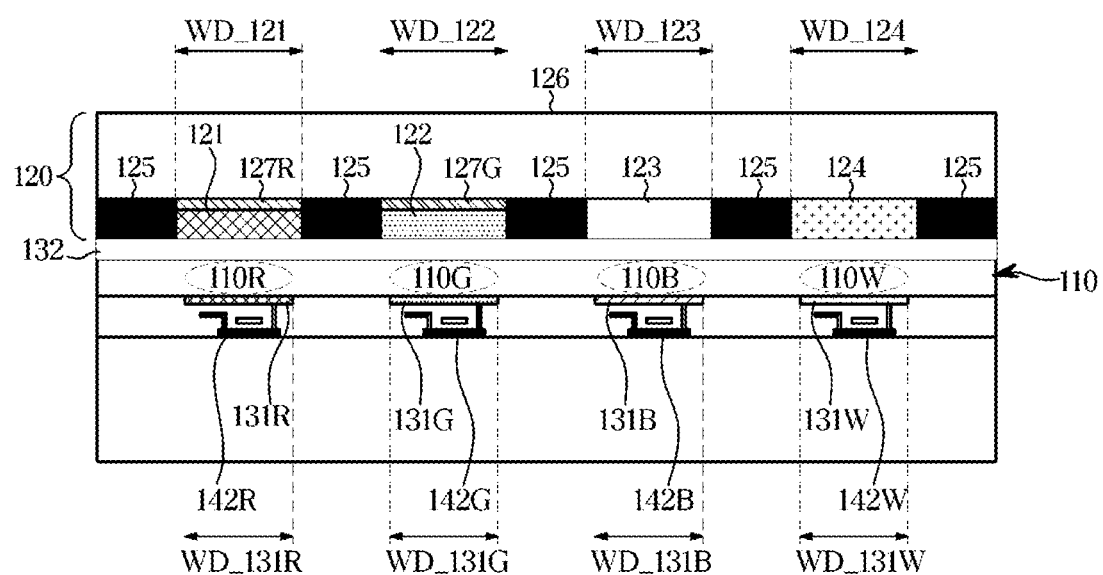
FIG. 17 is a cross-sectional view illustrating a structure of a display panel further including a blue light blocking filter according to an embodiment.
Figure 18:
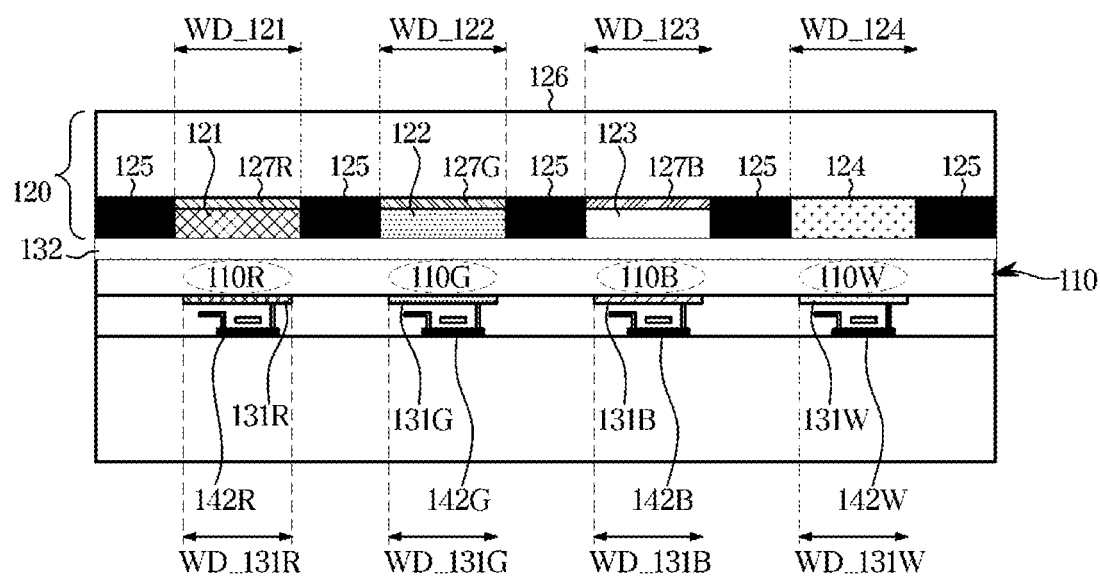
FIG. 18 is a cross-sectional view illustrating a structure of a display panel further including a blue light blocking filter according to an embodiment.

FIGS. 17 and 18 are cross-sectional views illustrating a structure of a display panel further including a blue light blocking filter, according to an embodiment.

As mentioned above, the red light converter 121 converts the blue light BL, which is incident from the light source 110, into the red light RL and the green light converter 122 converts the blue light BL, which is incident from the light source 110, into the green light GL. At this time, among the blue light beams BL incident on the red light converter 121, blue light beams BL, which are not converted into the red light RL, may be present, and among the blue light beams BL incident on the green light converter 122, blue light beams BL, which are not converted into the green light GL, may be present.

When the blue light beams BL, which are not converted into the intended color, are emitted from the red light converter 121 or the green light converter 122, the color purity of the red or green sub-pixel may be lowered. Therefore, as for the display panel 100 according to an embodiment, blue light blocking filters 127R and 127G configured to block blue light BL may be arranged in front of the red light converter 121 and on a front surface of the green light converter 122, as illustrated in FIG. 17.

For example, the blue light blocking filters 127R and 127G may block the blue light BL by absorbing the blue light BL. The blue light beams BL, which are not converted into the red light RL in the red light converter 121, and the blue light beams BL, which are not converted into the green light GL in the green light converter 122, may be absorbed by the blue light blocking filters 127R and 127G and thus it is possible to prevent the degradation of the color purity of the red sub-pixel and the green sub-pixel caused by the leakage of the blue light BL.

Alternatively, the blue light blocking filters 127R and 127G may absorb not only the blue light BL but also other light except for the red light RL or the green light GL. For example, the blue light blocking filter 127R provided in the red light converter 121 may be configured to transmit light having a wavelength of approximately 620 nm to 740 nm and to absorb light having a wavelength of the other range. In addition, the blue light blocking filter 127G provided in the green light converter 122 may be configured to transmit light having a wavelength of approximately 520 nm to 550 nm and to absorb light having a wavelength of the other range.

Meanwhile, because the light transmitting portion 123 is intended to emit the blue light BL, the blue light blocking filter is not used for the light transmitting portion 123. However, as illustrated in FIG. 18, when a blue light transmission filter 127B configured to transmit blue light BL and to block other light including red light RL and green light GL is arranged in front of the light transmitting portion 123, it is possible to reduce reflectance of external light. Further, the red light RL, the green light GL or the yellow light YL, which are from the adjacent sub-pixels, may be prevented from being introduced to the light transmitting portion 123.

For example, the blue light transmission filter 127B may block the red light RL and the green light GL by transmitting the blue light BL and absorbing other light among the incident light. For this, the blue light transmission filter 127B may be configured to transmit light having a wavelength of approximately 435 nm and approximately 500 nm.

Meanwhile, a color filter configured to absorb light of a specific wavelength may not be arranged on the front surface of the white light generator 124. Therefore, because the white light generator 124 does not generate the photon loss due to the color filter, the white light generator 124 may output white light having high efficiency and high brightness.

FIGS. 19 to 22 are cross-sectional views illustrating a structure of a display panel further including an additional component, according to an embodiment.

Figure 19:
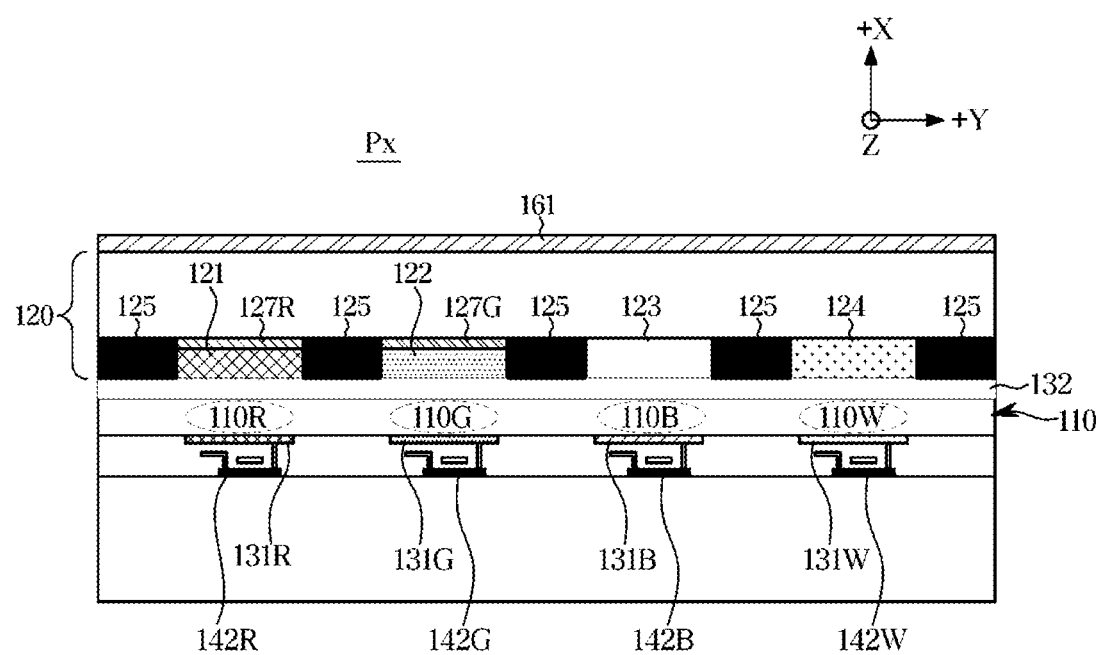
FIG. 19 is a cross-sectional view illustrating a structure of a display panel further including an additional component according to an embodiment.

Referring to FIG. 19, an anti-reflection layer 161 configured to block reflection of external light may be arranged in front of the color filter substrate 126. The anti-reflection layer 161 may include a polarizing plate, or may include an anti-reflection (AR) coating layer or an anti-glare low-reflection (AGLR) coating layer.

For example, the anti-reflection layer 161 may include a coating layer coated with a material having a high refractive index and a coating layer coated with a material having a low refractive index. The coating layers may be arranged to cross each other in multiple layers.

The material having a low refractive index may employ a low refractive index oxide such as silicon dioxide (SiO2). The material having a high refractive index may employ at least one of titanium dioxide (TiO2), zirconium dioxide (ZrO2), lithium niobate (LiNbO3), lithium tantalate (LiTaO3) and lanthanum titanium (LaTiO2).

According to embodiments, the coating layer coated with a material having a high refractive index may have a refractive index of 1.70 or more and 2.80 or less, or 1.90 or more and 2.80 or less. According to embodiments, the coating layer coated with a material having a low refractive index may have a refractive index of 1.20 or more and 1.50 or less.

When the anti-reflection layer 161 is formed, it is possible to prevent the image distortion caused by the reflection of the external light incident from the outside of the display apparatus 1. Further, it is possible to reduce Fresnel reflection ratio indicating that some of light beams, which is passing through the color filter substrate 126 and moving to the outside, are reflected at the interface between the color filter substrate 126 and the outside air and then return to the inside of the color filter substrate 126, and thus it is possible to improve the transmission efficiency, thereby improving the output light efficiency.

According to an embodiment, when the anti-reflection layer 161 is formed on the display panel 100 as in the example of FIG. 19, it is possible to omit the blue light transmission filter 127B configured to reduce reflectance of the external light.

Figure 20:
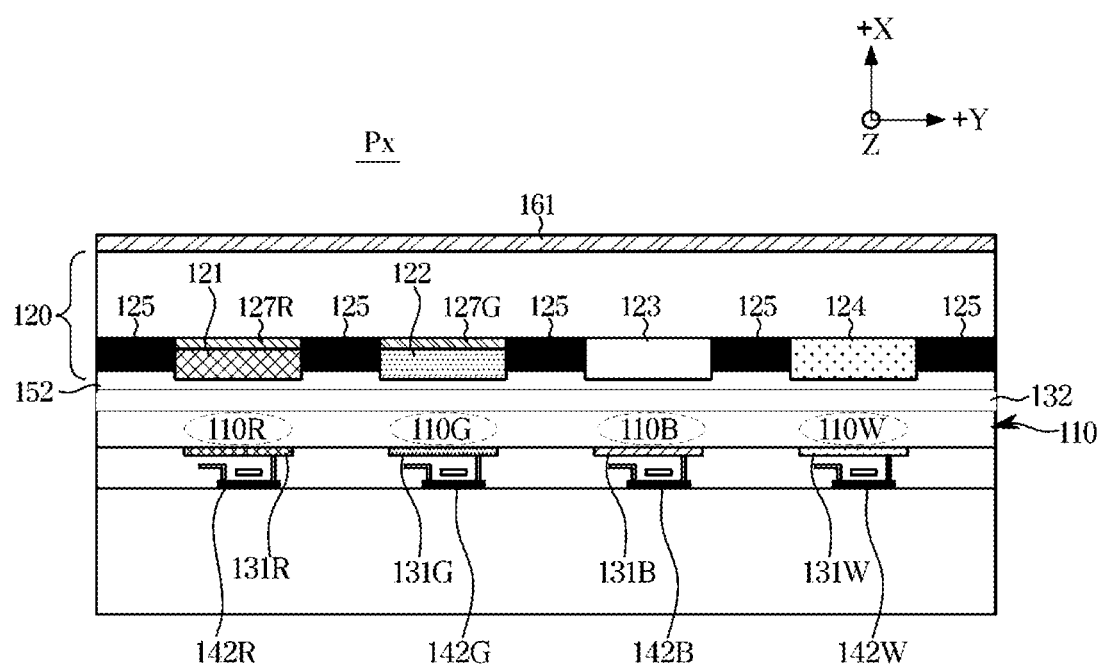
FIG. 20 is a cross-sectional view illustrating a structure of a display panel further including an additional component according to an embodiment.

Referring to FIG. 20, because a step may be formed between the members included in the quantum dot color filter layer 120, the display panel 100 may further include a planarization layer 152 configured to compensate a step. The planarization layer 152 may be formed in rear of the quantum dot color filter layer 120. The planarization layer 152 may be referred to as an overcoat.

According to embodiments, the planarization layer 152 may be formed of a material selected from a group consisting of polyacrylates resin, epoxy resin, phenolic resin, polyimide resin, unsaturated polyesters resin, poly phenylenethers resin, poly phenylenesulfides resin and benzocyclobutene (BCB). However, the material is merely examples of materials that can be used in the planarization layer 152, and the embodiment of the display panel 100 is not limited thereto.

When the planarization layer 152 is formed on the quantum dot color filter layer 120, it is possible to improve the luminous efficiency and to implement the excellent image quality although there is a step between the members included in the quantum dot color filter layer 120 and thus the surface thereof is not flat.

Figure 21:
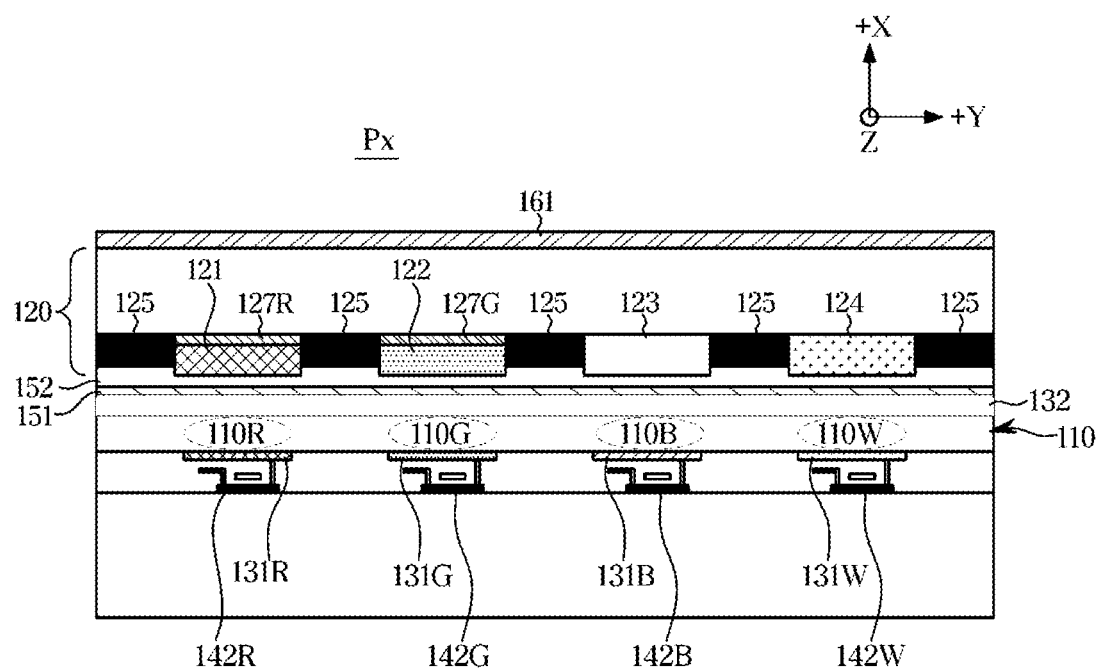
FIG. 21 is a cross-sectional view illustrating a structure of a display panel further including an additional component according to an embodiment.

In addition, as illustrated in FIG. 21, an encapsulation member 151 configured to prevent deterioration of a material caused by moisture and oxygen may be arranged in front of the cathode 132. When the encapsulation member 151 is provided, the planarization layer 152 may be arranged in front of the encapsulation member 151.

The encapsulation member 151 may protect the light source 110 and various circuit elements by sealing them from the outside. The encapsulation member 151 may be a sealant formed of various materials such as glass, quartz, ceramic, plastic, and metal.

The partition 125 configured to partition each of the cells (the red light converter, the green light converter, the light transmitting portion, and the white light generator) included in the quantum dot color filter layer 120 may include a black material to absorb light. For example, the partition 125 may be formed of a material such as a metal, a synthetic resin, a synthetic rubber, and a carbon-based organic material. Particularly, the partition 125 may be formed of chromium (Cr), chromium oxide (CrOx) or a double layer including chromium (Cr) or chromium oxide (CrOx). When the partition 125 is formed of a material that absorbs light, the movement of light between sub-pixels is blocked, thereby preventing color mixture and improving contrast. Further, the reflectance of external light may be reduced.

Figure 22:
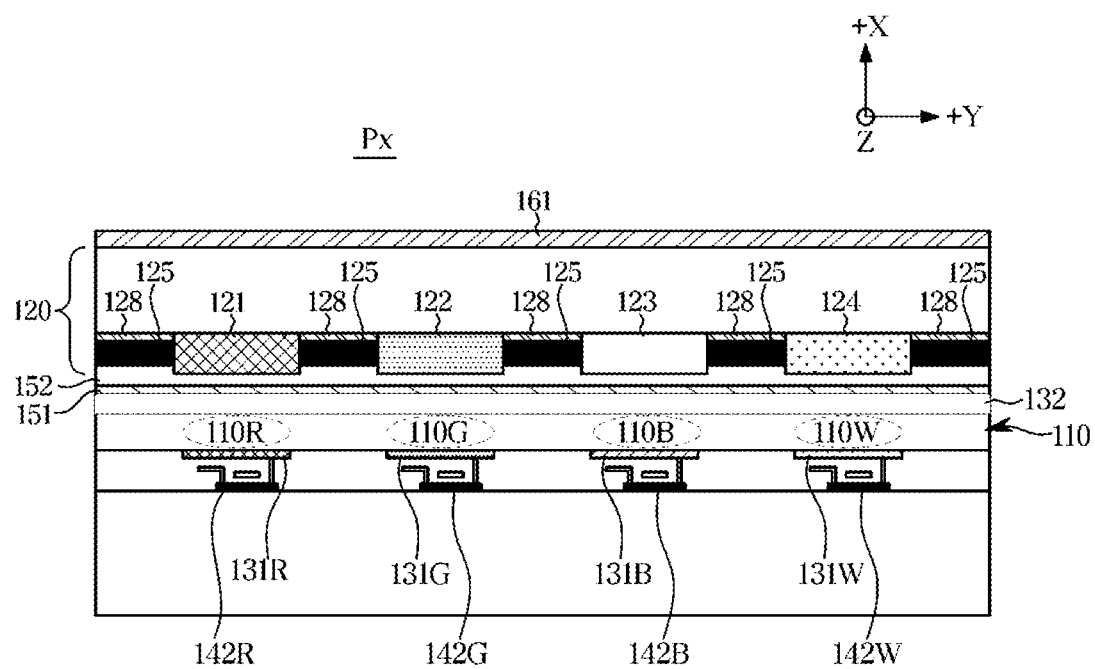
FIG. 22 is a cross-sectional view illustrating a structure of a display panel further including an additional component according to an embodiment.

Alternatively, as illustrated in FIG. 22, a reflective layer 128 configured to reflect light may be formed on a front surface of the partition 125 to reduce the reflectance of external light. The material of the reflective layer 128 may be a reflective material such as TiO2, ZnO, Fe2O3, CrO, CoO, SnO2, talc, and kaolin (Al2Si2O5 (OH) 4). For example, the reflective layer 128 may be formed by coating the front surface of the partition 125 with a reflective material.

When the reflective layer 128 is formed on the front surface of the partition 125, the anti-reflection layer 161 arranged in front of the color filter substrate 126 may be omitted.

Figure 23:
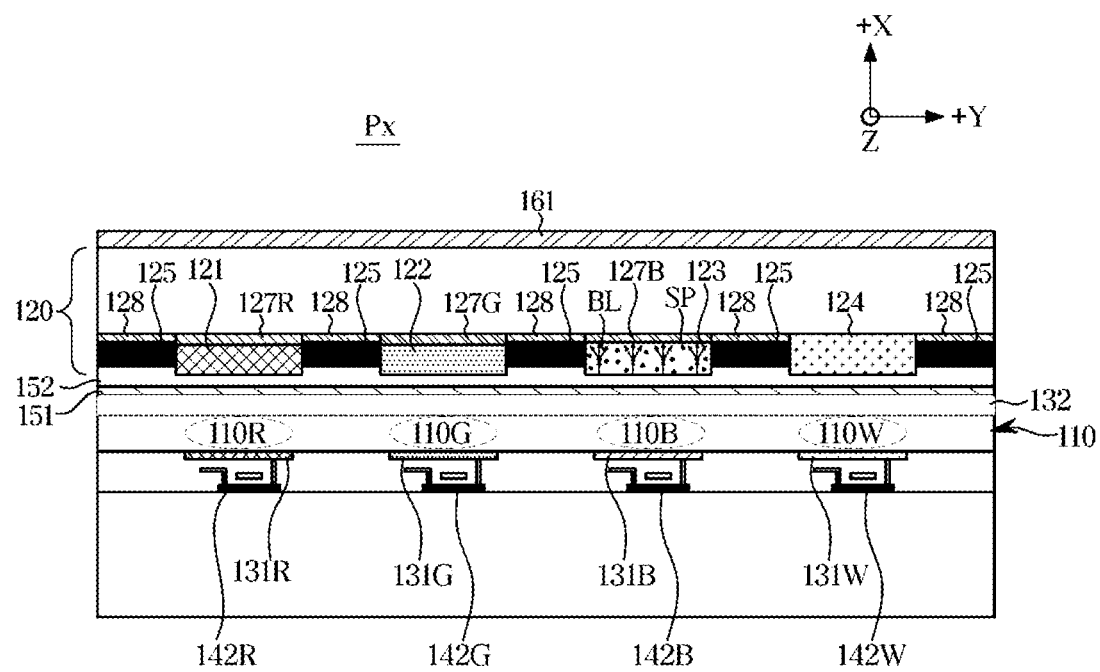
FIG. 23 is a cross-sectional view illustrating a configuration of a light transmitting portion contained in the display panel according to an embodiment.
Figure 24:
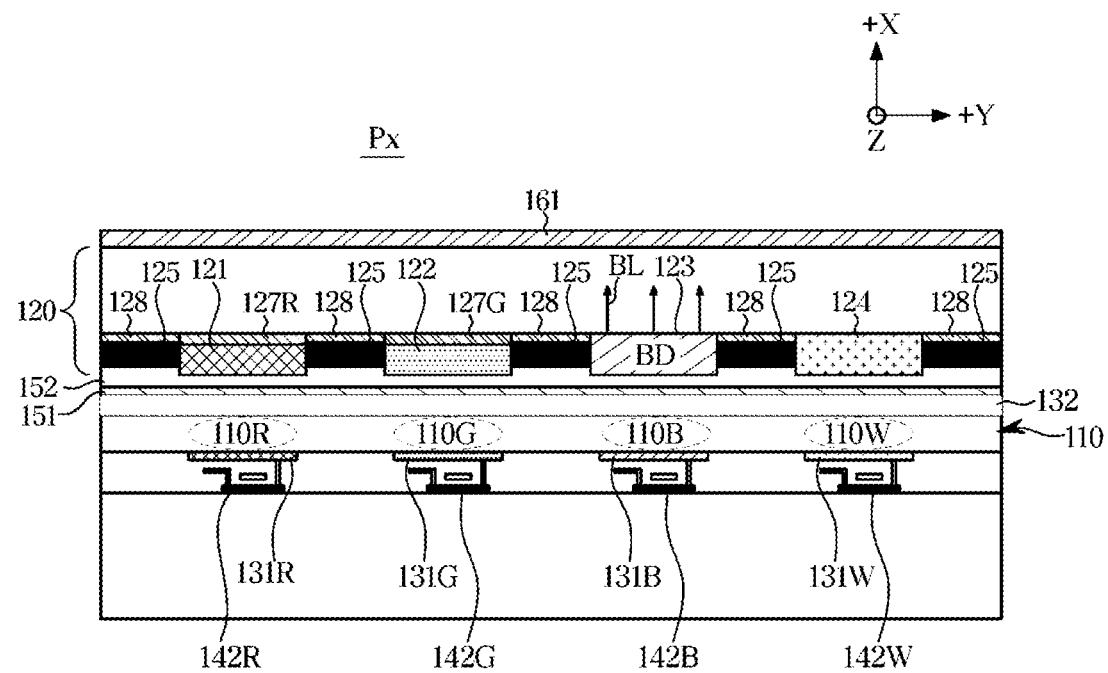
FIG. 24 is a cross-sectional view illustrating a configuration of a light transmitting portion contained in the display panel according to an embodiment.

FIGS. 23 and 24 are cross-sectional views illustrating a configuration of a light transmitting portion contained in the display panel according to an embodiment.

Referring to FIG. 23, the light transmitting portion 123 of the quantum dot color filter layer 120 may include scattering particles SP that scatter incident light. The scattering particles SP may be any pattern or a predetermined pattern and may be distributed in the light transmitting portion 123.

As the scattering particles SP, materials such as zinc oxide, titanium oxide and silicon oxide may be used.

A color of the blue light BL incident on the red light converter 121, the green light converter 122 and the white light generator 124 is converted by the red quantum dot particles 121P, the green quantum dot particles 122P, and yellow quantum dot particles 124P, respectively, and scattered and emitted. When the scattering particles SP are not contained in the light transmitting portion 123, the incident blue light BL may be immediately transmitted without the scattering and thus color viewing angle may be relatively degraded in comparison with the red light RL, the green light GL, and the yellow light YL.

When scattering particles SP are contained in the light transmitting portion 123, the incident blue light BL is scattered by the scattering particles SP, and the diffused blue light BL may be emitted. Therefore, it is possible to prevent relative color viewing angle degradation and it is possible to improve the reflectance of external light.

However, when the blue light BL scattered by the light transmitting portion 123 is emitted, the effect of blocking the reflection of the external light by the anti-reflection layer 161 may be deteriorated. Therefore, when the light transmitting portion 123 includes the scattering particles SP, although the anti-reflection layer 161 is provided, it is possible to reduce the reflectance of external light by arranging the blue light transmission filter 127B, which is configured to transmit only the blue light and absorb remaining light, on the front surface of the light transmitting portion 123.

According to an embodiment, as illustrated in FIG. 24, the light transmitting portion 123 may include a blue dye (BD). For example, the blue dye BD may be a dye that transmits blue light BL and absorbs all light other than blue light. When blue dye BD is contained in the light transmitting portion 123, it is possible to reduce the artifacts generated by the external light or ambient light being incident on the light transmitting portion 123.

According to an embodiment, the light transmitting portion 123 may include both the scattering particles SP and the blue dye BD. When the light transmitting portion 123 includes both the scattering particles SP and the blue dye BD, it is possible to improve the output light efficiency while reducing the artifacts caused by the external light or the ambient light.

FIG. 25 is a control block diagram illustrating the display apparatus according to an embodiment.

Referring to FIG. 25, the display apparatus 1 according to an embodiment includes the display panel 100, the input interface 103 configured to receive a user command and the controller 200.

According to an embodiment, the controller 200 controls the display panel 100 to display still images or moving images. As described above, in the display panel 100, each of the sub-pixels may be independently controlled. Accordingly, the controller 200 may perform on/off control or brightness control of the red sub-pixel, the green sub-pixel, the blue sub-pixel, and the white sub-pixel based on an image signal to be output.

The controller 200 may turn on the sub-pixel by supplying the current to the light source 110 through the pixel electrode of the sub-pixel by inputting the on signal to the gate line of the TFT array 140.

Based on an image signal to be output, the controller 200 may select which one of the red sub-pixel, the green sub-pixel, the blue sub-pixel, and the white sub-pixel included in each single pixel, to turn on and select how much amount current to be applied to the turned on sub-pixel.

The controller 200 may turn on only one sub-pixel according to a color to be implemented through a single pixel or the controller 200 may turn on two or more sub-pixels for color mixing.

For example, in order to output the red light RL, the controller 200 may allow the red pixel electrode 131R corresponding to the red light converter 121 to supply a current to the red sub-pixel region 110R of the light source 110. In order to output the green light GL, the controller 200 may allow the green pixel electrode 131G corresponding to the green light converter 122 to supply a current to the green sub-pixel region 110G of the light source 110. In order to output the blue light BL, the controller 200 may allow the blue pixel electrode 131B corresponding to the light transmitting portion 123 to supply a current to the blue sub-pixel region 110B of the light source 110.

In order to output the white light WL, the controller 200 may allow the white pixel electrode 131W corresponding to the white light generator 124 to supply a current to the white sub-pixel region 110W of the light source 110. As needed, the controller 200 may correct the white balance by turning on the red sub-pixel, the green sub-pixel, and the blue sub-pixel. At this time, the controller 200 may turn on the red sub-pixel, the green sub-pixel, and the blue sub-pixels with a relatively micro-current in comparison with the white sub-pixel. For example, while allowing the white pixel electrode 131W corresponding to the white light generator 124 to supply a current to the white sub-pixel region 110W of the light source 110 to output the white light WL, the controller 200 may allow the red pixel electrode 131R to supply a micro-current to the red sub-pixel region 110R of the light source 110, allow the green pixel electrode 131G to supply a micro-current to the green sub-pixel region 110G of the light source 110 and allow the blue pixel electrode 131B to supply a micro-current to the blue sub-pixel region 110B of the light source 110.

Allowing the red pixel electrode 131R to supply a current to the red sub-pixel region 110R of the light source 110 may include turning on the red pixel TFT 142R, allowing the green pixel electrode 131G to supply a current to the green sub-pixel region 110G of the light source 110 may include turning on the green pixel TFT 142G, and allowing the blue pixel electrode 131B to supply a current to the blue sub-pixel region 110B of the light source 110 may include turning on the blue pixel TFT 142B. Allowing the white pixel electrode 131W to supply a current to the white sub-pixel region 110W of the light source 110 may include turning on the white pixel TFT 142W.

FIG. 26 is a table comparing relative efficiency of a red sub-pixel, a green sub-pixel and a blue sub-pixel with relative efficiency of a white sub-pixel in the display panel according to an embodiment.

In a table of FIG. 26, a case #1 is the efficiency of the red sub-pixel, the green sub-pixel, and the blue sub-pixel, and a case #2 is the efficiency of the white sub-pixel configured to convert some beams of the incident light beams to yellow light.

As described above, because the white light generator 124 converts some beams of the incident blue light beams BL into yellow light YL, it is possible to maintain the yellow quantum dot particles 124P at the relatively low concentration in comparison with the concentration of the quantum dot particles in the red light converter 121 or the green light converter 122. Therefore, it is possible to reduce the efficiency loss caused by the re-absorption of the converted light. As illustrated in FIG. 26, when the conversion efficiency of the white sub-pixel is 100%, the conversion efficiency of the red sub-pixel, the green sub-pixel, and the blue sub-pixel is measured to be about 81%, which means that the conversion efficiency of the white sub-pixel is relatively excellent.

In addition, because the white light generator 124 does not employ the blue light blocking filter 127R and 127G configured to prevent blue light leakage and the blue light transmission filter 127B configured to block all light other than blue light, there is no photon loss caused by the use of those filters. Therefore, as illustrated in FIG. 26, when the photon efficiency of the white sub-pixel is 100%, the photon efficiency of the red sub-pixel, the green sub-pixel and the blue sub-pixel is measured to be about 70%, which means that the photon efficiency of the white sub-pixel is relatively excellent.

As mentioned above, the white light generator 124 converts the incident light into yellow light having an emission peak wavelength of wavelength band having the excellent visibility. As illustrated in FIG. 26, when the visibility of white sub-pixels is 100%, the visibility of the red sub-pixel, the green sub-pixel and the blue sub-pixel is measured to be about 75%, which means that the visibility of the white sub-pixel is relatively excellent.

Thus, it can be seen that the overall efficiency of the white sub-pixels is better than that of the other sub-pixels. In a state in which the red sub-pixel, the green sub-pixel and the blue sub-pixel are turned on to implement white light without the separated white sub-pixel, efficiency deterioration occurring in each sub-pixel may have an influence on implementing a white color. Therefore, it is difficult to implement a white color with high efficiency and high brightness.

On the other hand, in a state in which a white sub-pixel having the same structure as the display panel 100 and the display apparatus 1 according to an embodiment is provided, when the white sub-pixel is turned on to implement a white color, it is possible to implement a white color with high efficiency and high brightness.

Figure 27:
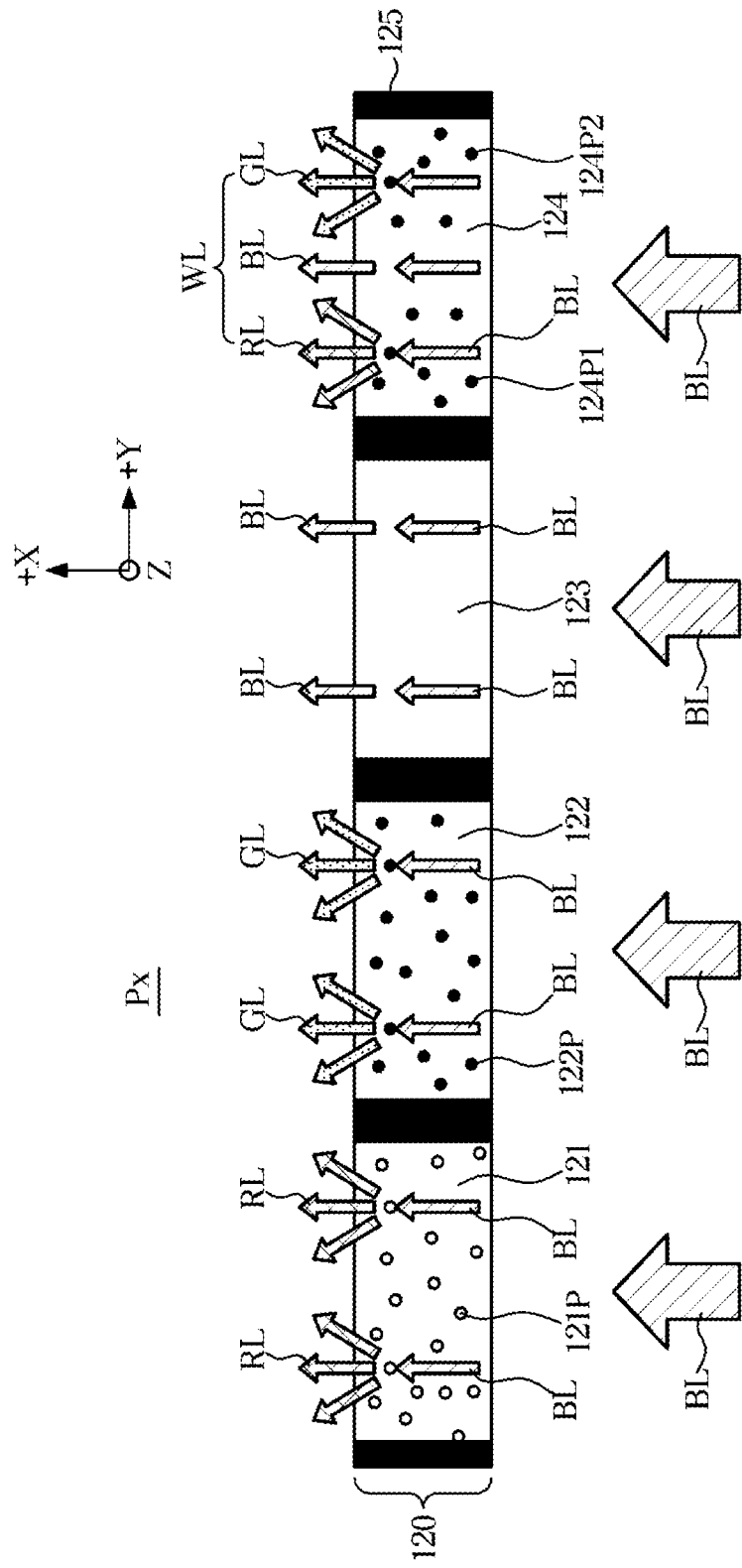
FIG. 27 is a view illustrating another example of generating white light by the display panel according to an embodiment.

FIG. 27 is a view illustrating an example of generating white light by the display panel according to an embodiment.

According to the above-mentioned embodiment, the blue light BL is converted into the yellow light YL by using the yellow quantum dot particles 124P in the white light generator 124, and the white light WL is generated by mixing the yellow light YL with the blue light BL.

According to another example, as illustrated in FIG. 27, the white light generator 124 may include a plurality of red quantum dot particles 124P1 configured to convert incident light into red light RL and a plurality of green quantum dot particles 124P2 configured to convert incident light into green light GL.

When the blue light BL emitted from the light source 110 is incident on the white light generator 124, the red quantum dot particles 124P1 may convert the incident blue light BL into the red light RL and the green quantum dot particles 124P2 may convert the incident blue light BL into the green light GL. Some beams of the blue light beams BL incident on the white light generator 124 may be converted into yellow light YL and remaining beams may be emitted as the blue light BL without conversion. Therefore, the red light RL, the green light GL and the blue light BL emitted from the white light generator 124 are mixed, thereby generating white light WL.

Because the white light generator 124 converts some beams of the incident blue light beams BL into the red light RL and the green light GL, which is the same as a case in which the white light generator 124 includes the yellow quantum dot particles 124P, it is possible to maintain the yellow quantum dot particles 124P at the low concentration. Therefore, it is possible to suppress the re-absorption of the converted light which occurs when the distance between the quantum dot particles is narrow, and it is possible to reduce the efficiency loss caused by the re-absorption of the converted light.

As is apparent from the above description, it is possible to obtain improved brightness by implementing a white color by providing a separate white sub-pixel used to implement a white color and by turning on the white sub-pixel.

It is possible to reduce the loss, which is caused by quantum dot color conversion, by using a mixed color of blue and yellow upon implementing a white sub-pixel, and a display apparatus having the same.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display panel comprising:
    a light source configured to emit blue light; and
    a quantum dot color filter layer comprising:
        a red light converter comprising a red quantum dot particle configured to convert the blue light into red light,
        a green light converter comprising a green quantum dot particle configured to convert the blue light into green light,
        a light transmitting portion configured to transmit the blue light, and
        a white light generator comprising a first region and a second region,
    wherein the first region comprises a plurality of yellow quantum dot particles configured to convert the blue light into yellow light,
    wherein the second region transmits the blue light.

2. The display panel of claim 1, wherein the yellow light has an emission peak wavelength in a range of 540 nm to 580 nm.

3. The display panel of claim 1, further comprising:
    a blue light blocking filter arranged at a front of the red light converter and a front of the green light converter, and configured to block blue light.

4. The display panel of claim 1, further comprising:
    a blue light transmission filter arranged at a front of the light transmitting portion and configured to transmit the blue light and to block all light other than the blue light.

5. The display panel of claim 1, wherein the light source comprises:
    a red sub-pixel region configured to emit the blue light toward the red light converter;
    a green sub-pixel region configured to emit the blue light toward the green light converter;
    a blue sub-pixel region configured to emit the blue light toward the light transmitting portion; and
    a white sub-pixel region configured to emit the blue light toward the white light generator.

6. The display panel of claim 5, further comprising an anode comprising:
    a red pixel electrode configured to supply a first current to the red sub-pixel region;
    a green pixel electrode configured to supply a second current to the green sub-pixel region;
    a blue pixel electrode configured to supply a third current to the blue sub-pixel region; and
    a white pixel electrode configured to supply a fourth current to the white sub-pixel region.

7. The display panel of claim 6, wherein a size of the red pixel electrode is smaller than a size of the red light converter, a size of the green pixel electrode is smaller than a size of the green light converter, a size of the blue pixel electrode is smaller than a size of the light transmitting portion, and a size of the white pixel electrode is smaller than a size of the white light generator.

8. The display panel of claim 1, further comprising a plurality of partitions,
    wherein a first partition of the plurality of partitions is arranged between the red light converter and the green light converter, a second partition of the plurality of partitions is arranged between the green light converter and the light transmitting portion, and a third partition of the plurality of partitions is arranged between the light transmitting portion and the white light generator, and wherein the plurality of partitions is formed of a black material absorbing light.

9. The display panel of claim 8, further comprising:
a reflective layer formed on a front surface of the plurality of partitions and configured to reflect incident light.

10. The display panel of claim 1, further comprising an anti-reflection layer arranged at a front of the quantum dot color filter layer, and configured to prevent reflection of external light.

11. The display panel of claim 1, wherein the light transmitting portion comprises a scattering particle configured to scatter incident light.

12. The display panel of claim 1, wherein the light transmitting portion comprises a blue dye configured to transmit the blue light among incident light and absorb all light other than the blue light.

13. The display panel of claim 1, wherein the plurality of the yellow quantum dot particles in the white light generator have a concentration relatively low in comparison with a concentration of the quantum dot particles in the red light converter or the green light converter.

14. A display panel comprising:
a light source configured to emit blue light; and
a quantum dot color filter layer comprising:
  a red light converter comprising a red quantum dot particle configured to convert the blue light into red light,
  a green light converter comprising a green quantum dot particle configured to convert the blue light into green light,
  a light transmitting portion configured to transmit the blue light, and
  a white light generator comprising a red quantum dot particle configured to convert a first portion of the blue light into red light, a green quantum dot particle configured to convert a second portion of the blue light into green light,
wherein the white light generator is configured to transmit a third portion of the blue light.

15. A display apparatus comprising:
a light source configured to emit blue light;
a quantum dot color filter layer comprising:
  a red light converter comprising a red quantum dot particle configured to convert the blue light into red light,
  a green light converter comprising a green quantum dot particle configured to convert the blue light into green light,
  a light transmitting portion configured to transmit the blue light, and
  a white light generator comprising a yellow quantum dot particle configured to convert a first portion of the blue light into yellow light, wherein the white light generator is further configured to transmit a second portion of the blue light;
an anode comprising:
  a red pixel electrode corresponding to the red light converter,
  a green pixel electrode corresponding to the green light converter,
  a blue pixel electrode corresponding to the light transmitting portion, and
  a white pixel electrode corresponding to the white light generator; and
a controller configured to control the white pixel electrode to supply a current to the light source to output white light.

16. The display apparatus of claim 15, further comprising:
a thin film transistor (TFT) array comprising:
  a red pixel TFT connected to the red pixel electrode,
  a green pixel TFT connected to the green pixel electrode,
  a blue pixel TFT connected to the blue pixel electrode, and
  a white pixel TFT connected to the white pixel electrode,
wherein the controller is further configured to activate the white pixel TFT to output the white light.

17. The display apparatus of claim 5, wherein the yellow light has an emission peak wavelength in a range of 540 nm to 580 nm.

18. The display apparatus of claim 15, further comprising a blue light blocking filter arranged at a front of the red light converter and a front of the green light converter and configured to block blue light.

19. The display apparatus of claim 15, further comprising a blue light transmission filter arranged at a front of the light transmitting portion and configured to transmit blue light and to block all light other than the blue light.

20. The display apparatus of claim 15, further comprising an anti-reflection layer arranged at a front of the quantum dot color filter layer and configured to prevent reflection of external light.

21. The display apparatus of claim 15, wherein the light transmitting portion comprises a scattering particle configured to scatter incident light.

* * * * *